(12) United States Patent
Ikeguchi et al.

(10) Patent No.: US 6,866,919 B2
(45) Date of Patent: Mar. 15, 2005

(54) HEAT-RESISTANT FILM BASE-MATERIAL-INSERTED B-STAGE RESIN COMPOSITION SHEET FOR LAMINATION AND USE THEREOF

(75) Inventors: Nobuyuki Ikeguchi, Tokyo (JP); Morio Mori, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 10/368,370

(22) Filed: Feb. 20, 2003

(65) Prior Publication Data

US 2003/0162006 A1 Aug. 28, 2003

(30) Foreign Application Priority Data

Feb. 21, 2002 (JP) ........................................ 2002-044798
Feb. 28, 2002 (JP) ........................................ 2002-053654
Mar. 4, 2002 (JP) ........................................ 2002-057199
Mar. 7, 2002 (JP) ........................................ 2002-062065
Apr. 3, 2002 (JP) ........................................ 2002-101298

(51) Int. Cl.[7] ............................................... B32B 3/00
(52) U.S. Cl. ........................ 428/209; 428/901; 174/258
(58) Field of Search ................................ 428/209, 901; 174/258

(56) References Cited

U.S. PATENT DOCUMENTS

| | | | |
|---|---|---|---|
| 4,393,195 A | * 7/1983 | Gaku et al. | 528/361 |
| 4,396,679 A | * 8/1983 | Gaku et al. | 428/412 |
| 4,772,509 A | * 9/1988 | Komada et al. | 442/289 |
| 5,439,986 A | * 8/1995 | Hosogane et al. | 525/423 |
| 5,670,250 A | * 9/1997 | Sanville et al. | 428/323 |
| 5,965,245 A | * 10/1999 | Okano et al. | 428/209 |
| 6,245,696 B1 | * 6/2001 | Haas et al. | 442/348 |
| 6,362,436 B1 | * 3/2002 | Kimbara et al. | 174/260 |
| 6,562,179 B1 | * 5/2003 | Ikeguchi et al. | 156/307.5 |

* cited by examiner

Primary Examiner—Cathy F. Lam
(74) Attorney, Agent, or Firm—Wenderoth, Lind & Ponack, L.L.P.

(57) ABSTRACT

The present invention relates to a heat-resistant film base-material-inserted B-stage resin composition sheet for producing a multilayer printed wiring board which is excellent in copper adhesive strength, heat resistance and insulating reliability particularly in the Z direction and is suitable for use, as a high density small printed wiring board, in a semiconductor-chip-mounting, small-sized and lightweight novel semiconductor plastic package, and to a use thereof.

11 Claims, 12 Drawing Sheets

FIG. 3
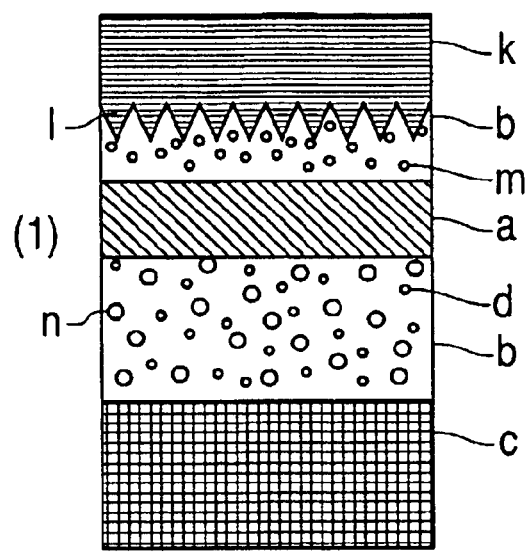
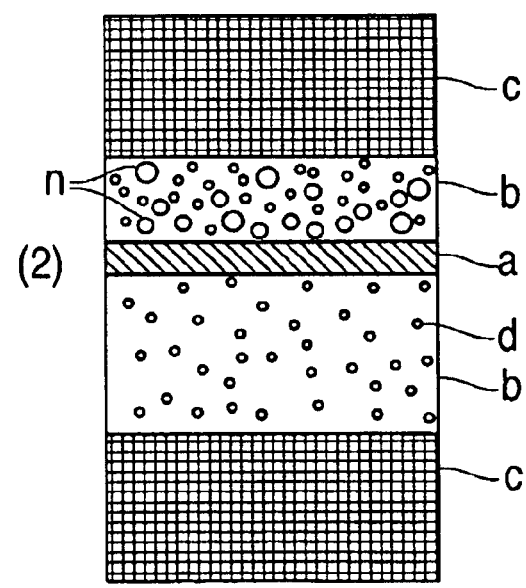

FIG. 5
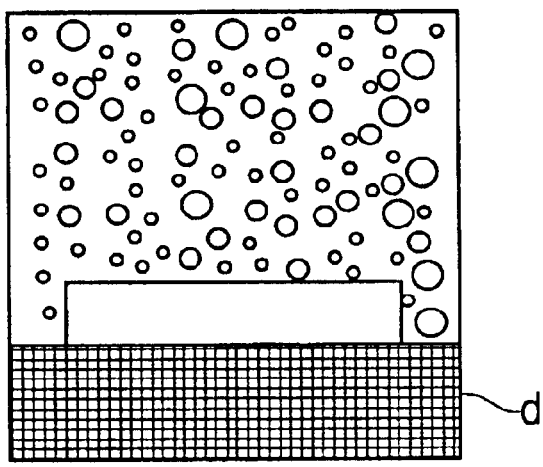
(1)
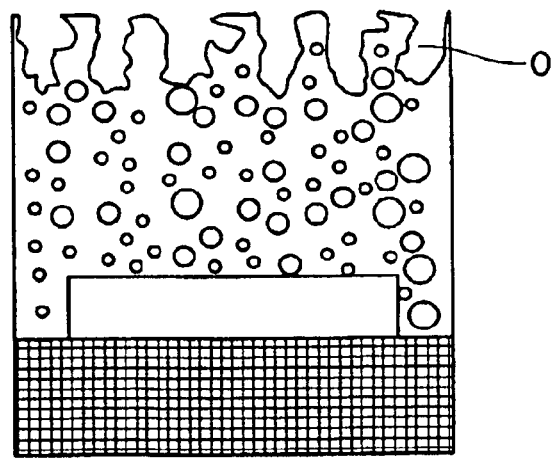
(2)

FIG. 6
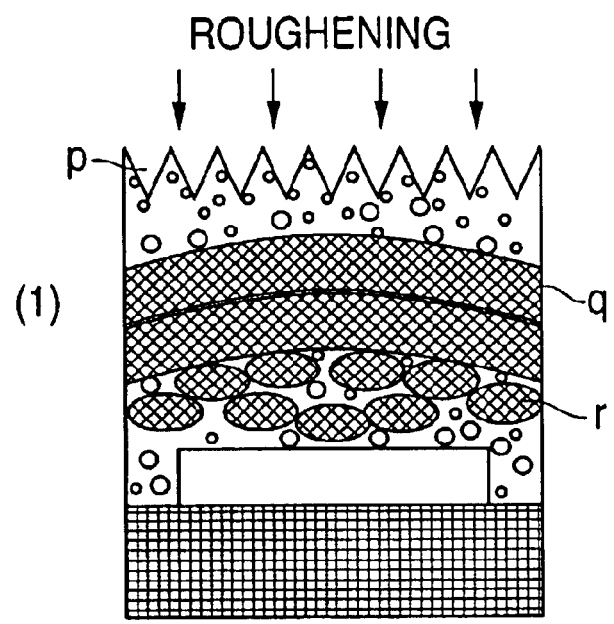
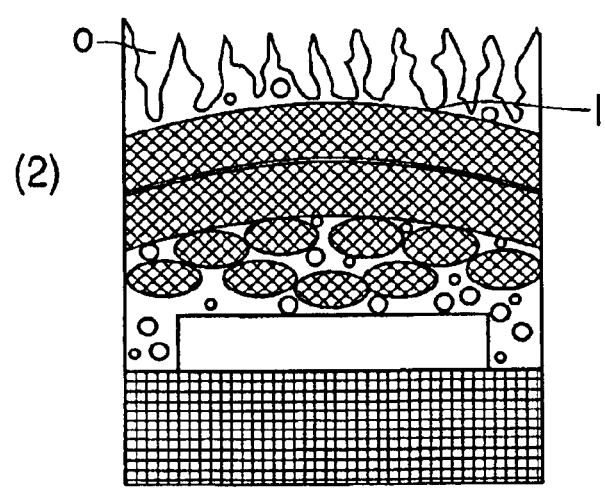

FIG. 7
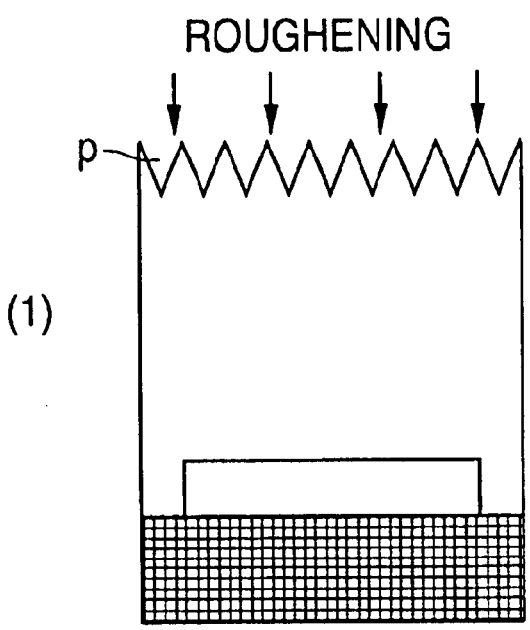
(1)
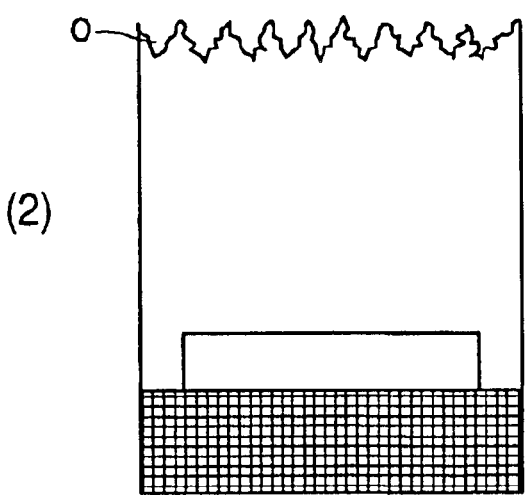
(2)

(1)

HEAT-RESISTANT FILM BASE-MATERIAL-INSERTED B-STAGE RESIN COMPOSITION SHEET FOR LAMINATION AND USE THEREOF

FIELD OF THE INVENTION

The present invention relates to a heat-resistant film base-material-inserted B-stage resin composition sheet for producing a multilayer printed wiring board by lamination, its use and its production process. More specifically, a high-density multilayer printed wiring board excellent in copper adhesive strength, heat resistance and insulating reliability particularly in the Z direction can be produced by using the B-stage resin composition sheet of the present invention between circuit substrates or on an external layer at the time of multilayer formation. The obtained multilayer printed wiring board is suitable for use, as a high density small printed wiring board, in a semiconductor-chip-mounting, small-sized and lightweight novel semiconductor plastic package.

BACKGROUND OF THE INVENTION

In recent years, a high-density multilayer printed wiring board is used in electronic equipment that is increasingly becoming smaller, thinner and lighter. The multilayer printed wiring board is becoming thinner, and a multilayer printed wiring board having an insulating layer thickness of 20 to 30 μm between an internal copper foil and an external copper foil is produced. Conventionally, a glass fiber woven cloth or nonwoven cloth or an organic fiber woven cloth or nonwoven cloth is used as a base material for a B-stage resin composition sheet for buildup lamination. However, there is a limitation on the making of a thin base material, so that resin layers can not be sufficiently formed on front and reverse surfaces of the base material. After laminate-molding, the base material is in contact with an internal copper foil and an external copper foil so that the migration resistance in the Z direction and the soldering heat resistance after moisture absorption are poor. Accordingly, there is a problem in reliability as a high-density multilayer printed wiring board.

Further, an adhesive sheet obtained by attaching a B-stage resin composition to a release film or a copper foil is used. However, when the adhesive sheet is used to produce a high-density multilayer printed wiring board having a small insulating layer thickness, the obtained multilayer printed wiring board is poor in reliability such as migration resistance in the Z direction. Further, it is also poor in electric characteristics and heat resistance so that it has a limitation in use as a high-density printed wiring board.

Further, concerning the production of a high-density multilayer printed wiring board, there is a method of producing a multilayer printed wiring board by using an additive process as a method for forming a fine circuit. An additive process multilayer printed wiring board using a conventional adhesive sheet which is obtained by adding a large amount of rubber into an epoxy resin and is not reinforced with base material, is poor in reliability such as migration resistance in the Z direction, particularly when the insulating layer thickness is small. Further, the above additive process multilayer printed wiring board is also poor in electric characteristics and heat resistance so that it has a limitation in use as a high-density printed wiring board.

In addition, when an adhesive sheet for a subtractive process or an adhesive sheet for an additive process, each of which sheet is not reinforced with a base material, is used on each surface of a thin internal layer board, a buildup-multilayered printed wiring board is poor in mechanical strengths such as bending strength and tensile strength and elastic modulus (hardness) and warps and distortions are apt to occur. Further, a thickness variance after molding is large, which causes defectives in an assembly stage and the like.

SUMMARY OF THE INVENTION

It is an object of the present invention to provide a heat-resistant film base-material-inserted B-stage resin composition sheet for producing a high-density multilayer printed wiring board which is high in mechanical strengths, excellent in copper foil adhesive strength and heat resistance and also excellent in reliability by lamination like a conventional prepreg, use thereof and a process for the production thereof.

It is another object of the present invention to provide a heat-resistant film base-material-inserted B-stage resin composition sheet from which a multilayer printed wiring board excellent in insulating properties in the Z direction and excellent in reliability such as migration resistance can be produced particularly by using a heat-resistant film, use thereof and a process for the production thereof.

It is further another object of the present invention to provide a heat-resistant film base-material-inserted metal-foil-attached B-stage resin composition sheet for producing a high-density multilayer printed wiring board which is high in mechanical strengths, excellent in copper adhesive strength and heat resistance and also excellent in reliability by an additive process, use thereof and a process for the production thereof.

It is still further another object of the present invention to provide a thin-type high-density multilayer printed wiring board which is high in elastic modulus, excellent in copper adhesive strength and heat resistance and also excellent in reliability.

According to the present invention 1, there is provided a heat-resistant film base-material-inserted B-stage resin composition sheet for lamination, comprising a heat-resistant film base material and B-stage resin composition layers for lamination formed on both surfaces of the heat-resistant film base material.

According to the present invention 1, there is provided a heat-resistant film base-material-inserted B-stage resin composition sheet for lamination according to the above, wherein a metal foil is attached to one surface of the sheet.

According to the present invention 2, there is provided a heat-resistant film base-material-inserted B-stage resin composition sheet according to the above, wherein at least one layer of the B-stage resin composition layers formed on both surfaces of the heat-resistant film base material is a B-stage resin composition for an additive process.

According to the present invention 2, there is provided a heat-resistant film base-material-inserted B-stage resin composition sheet, wherein the metal foil attached to the one surface of the sheet has roughness on a metal foil surface on the resin composition side.

According to the present invention 2, there is provided a multilayer printed wiring board produced by stacking a conductor circuit and an interlayer resin insulating layer on a substrate sequentially, wherein a heat-resistant film layer is inserted in the insulating layer.

BRIEF DESCRIPTION OF DRAWINGS

FIG. 3 (1) is an explanatory drawing showing the structure of a heat-resistant film base-material-inserted B-stage resin composition sheet in Example 5.

FIG. 3 (2) is an explanatory drawing showing the structure of a heat-resistant film base-material-inserted B-stage resin composition sheet in Example 6.

FIG. 5 is an explanatory drawing showing steps of producing a printed wiring board in Comparative Example 10.

FIG. 6 is an explanatory drawing showing steps of producing a printed wiring board in Comparative Example 11.

FIG. 7 is an explanatory drawing showing steps of producing a printed wiring board in Comparative Example 12.

DETAILED DESCRIPTION OF THE INVENTION

Figure 1:
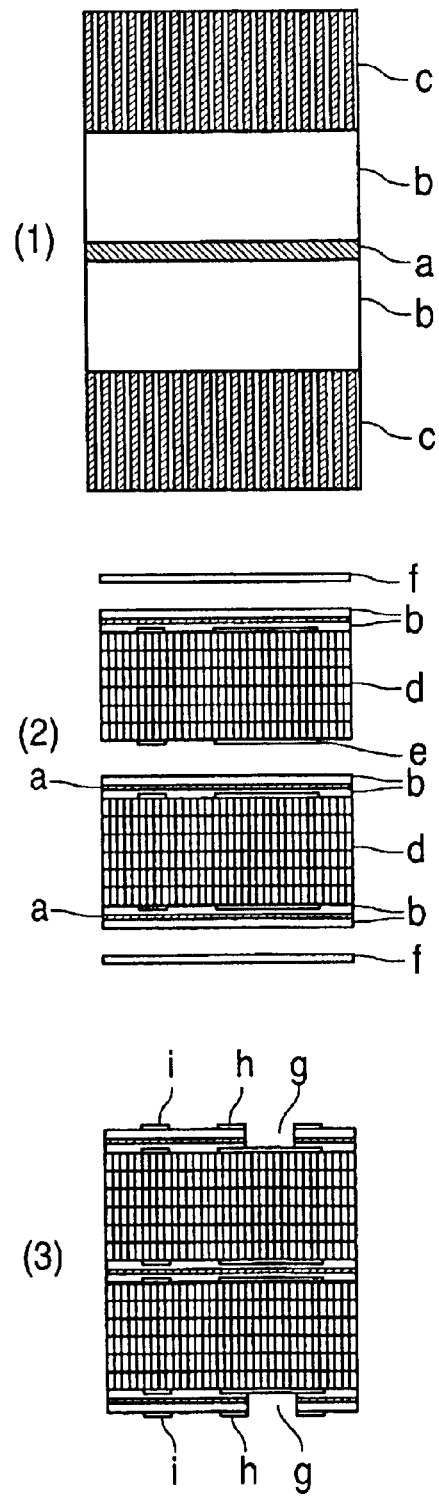
FIG. 1 is an explanatory drawing showing steps of producing a printed wiring board in Example 2.

In the present invention, symbols in drawings have the following meanings.

a: heat-resistant film, b: B-stage resin composition layer, c: release film, d: internal layer board insulating layer, e: internal layer copper foil circuit, f: copper foil, g: blind via hole, h: land, i: external layer copper foil circuit, j: copper foil convex portions, k: release film having roughness on one surface, l: concave and convex portions of release film, m: organic powder, n: inorganic powder, o: roughened concave and convex portions, p: release film having surface roughness or surface roughness after metal foil removal, q: glass fiber yarn, r: glass fiber cross section, s: protective film, t: prepreg, u: portion where a concave portion due to roughening reaches a glass cloth, v: aluminum foil, w: concave and convex portions of aluminum foil, x: B-stage resin composition layer for additive process, y: blind via hole filled with copper plating, z: second layer circuit formed by a semi-additive process, α: external layer circuit formed by a semi-additive process and β: resin filling through hole of internal layer substrate.

The present invention is characterized in that a B-stage resin composition sheet using a heat-resistant film as a base material is used as an adhesive sheet for producing a multilayer printed wiring board by stacking a conductor circuit and an interlayer resin insulating layer on an internal substrate concurrently or sequentially.

The heat-resistant film base-material-inserted B-stage resin composition sheet to be bonded to the internal substrate is a product in which thermosetting resin compositions are attached to both surfaces of the heat-resistant film. Heat-resistant film base-material-inserted B-stage resin composition sheets having release films or no materials attached to both surfaces are properly selected and used as required. Metal foils are used as outermost external layers. When the thickness of an insulating layer after molding is adjusted to 20 to 30 μm, the thickness of the heat-resistant film is preferably 4 to 20 μm, more preferably 4.5 to 12 μm. B-stage resin compositions which have the same constitution can be used on both surfaces of the heat-resistant film. Further, B-stage resin compositions which have different constitutions can be used.

Since the above heat-resistant film base-material-inserted B-stage resin composition sheet contains the heat-resistant film base material, a printed wiring board obtained by carrying out buildup using a particularly thin internal layer board is high in mechanical strength and small in warp and distortion and is excellent in molding thickness at the time of lamination as compared with a printed wiring board using a conventional B-stage resin composition sheet including no base material. The above printed wiring board is suitable for a thin-type high-density printed wiring board such as CSP. Further, the above printed wiring board is high in insulating reliability in the Z direction since the heat-resistant film interrupts the Z direction. Therefore, it is very excellent in migration resistance.

The resin compositions to be attached to the heat-resistant film, used in the present invention, are not specially limited. Concretely, the resin compositions include known resins such as an epoxy resin, a polyimide resin, a polyfunctional cyanate ester resin, a maleimide resin, a double-bond-addition polyphenylene ether resin and an epoxidized or cyanate-modified polyphenylene ether resin. The above resins may be used alone or in combination. Of these, the polyfunctional cyanate ester resin is preferred in view of migration resistance, heat resistance and heat resistance after moisture absorption.

Particularly, there is preferably used a thermosetting resin composition containing, as an essential component, a resin composition obtained by adding (b) an epoxy resin which is liquid at room temperature in an amount of 15 to 500 parts by weight to (a) a polyfunctional cyanate ester monomer and/or a polyfunctional cyanate ester prepolymer in an amount of 100 parts by weight and adding (c) a heat-curing catalyst in an amount ratio of 0.005 to 10 parts by weight per 100 parts of the (a+b) components. By using the above composition, there can be obtained a resin composition layer which is excellent in flexibility and is not easily cracked and peeled off when attached to the heat-resistant film. Therefore, it is preferred to use the above composition in view of increases in heat resistance and reliability.

The polyfunctional cyanate ester compound which is preferably used in the present invention refers to a compound whose molecule contains at least two cyanato groups. Specific examples of the above polyfunctional cyanate ester compound include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis(4-cyanatophenyl)propane, 2,2-bis(3,5-dibromo-4-cyanotophenyl)propane, bis(4-cyanatophenyl)ether, bis(4-cyanatophenyl) thioether, bis(4-cyanatophenyl)sulfone, tris(4-cyanatophenyl)phosphite, tris(4-cyanatophenyl) phosphate, and cyanates obtained by a reaction between novolak and cyan halide.

In addition to the above examples, there can be used polyfunctional cyanate ester compounds disclosed in Japanese Patent Publications Nos. 41-1928, 43-18468, 44-4791, 45-11712, 46-41112, 47-26853 and JP-A-51-63149. Further, prepolymers having a molecular weight of 400 to 6,000 and having a triazine ring formed by the trimerization of cyanato group of each of these polyfunctional cyanate ester compounds may be also used. The above prepolymer is obtained by polymerizing the above polyfunctional cyanate ester monomer in the presence of an acid such as a mineral acid or a Lewis acid; a base such as sodium alcoholate or a tertiary amine or a salt such as sodium carbonate as a catalyst. The prepolymer partially contains an unreacted monomer and is in the form of a mixture of monomer with prepolymer, and this material is preferably used in the present invention. When used, generally, it is dissolved in an organic solvent in which it is soluble. There can be used bromine-added compounds of these and liquid resins.

The epoxy resin which is liquid at room temperature can be generally selected from known epoxy resins. Specific examples thereof include a bisphenol A type epoxy resin, a bisphenol F type epoxy resin, a phenol novolak type epoxy resin, an alicyclic epoxy resin, diglycidyl compounds of polyether polyol and epoxidized compounds of acid anhydride. These epoxy resins may be used alone or in combination. The amount of the epoxy resin per 100 parts by weight of the polyfunctional cyanate ester compound and/or the polyfunctional cyanate ester prepolymer is 15 to 500 parts by weight, preferably 20 to 300 parts by weight. The term "liquid at room temperature" means "unbreakable at room temperature (25° C.)".

Besides the above liquid epoxy compounds, there may be used known solid epoxy resins, which are breakable at room temperature, of the above epoxy resins, further, a cresol novolak type epoxy resin, a biphenyl type epoxy resin and a naphthalene type epoxy resin as a slightly soluble resin. These resins may be used alone or in combination. These resins may have bromine or phosphorus in molecules and such resins are suitable for producing a flame resistant B-stage resin composition.

The thermosetting resin composition used in the present invention may contain various additives other than the above compounds as required so long as the inherent properties of the composition are not impaired. Examples of the additives include various resins, known bromine compounds and phosphorus compounds of these resins, various known additives such as inorganic or organic filler, a dye, a pigment, a thickener, a lubricant, an anti-foamer, a dispersing agent, a leveling agent, a photo-sensitizer, a flame retardant, a brightener, a polymerization inhibitor and a thixotropic agent. These additives may be used alone or in combination as required. A known curing agent or a known catalyst is incorporated into a compound having a reactive group as required.

The thermosetting resin composition used in the present invention undergoes curing itself under heat. Since, however, its curing rate is low, it is poor in workability and economic performances, etc., and a known heat-curing catalyst is incorporated into the thermosetting resin. The amount of the catalyst per 100 parts by weight of the thermosetting resin is 0.005 to 10 parts by weight, preferably 0.01 to 5 parts by weight.

The method of kneading the components of the present invention homogeneously may be selected from generally known methods. For example, the components are mixed and then the mixture is kneaded with a three-roll mill at room temperature or under heat. Otherwise, a generally known machine such as a ball mill or a mortar machine is used. Further, a viscosity is adjusted by adding a solvent so as to meet a processing method.

Further, the heat-resistant film base material of the heat-resistant film base-material-inserted B-stage resin composition sheet is not specially limited in kind and thickness and can be selected from known heat-resistant film base materials. Specifically, it includes a polyimide (kapton) film, a polyparabanic acid film, a liquid crystal polyester film and a wholly aromatic polyamide film. The thickness of the heat-resistant film base material is properly selected depending upon a purpose. For adjusting the insulating layer thickness after laminate-molding to a small thickness of approximately 20 to 40 $\mu$m, there is used a heat-resistant film having a thickness of preferably 4 to 20 $\mu$m, more preferably 4.5 to 12 $\mu$m. When an adhesive resin layer is formed on a surface of the heat-resistant film, it is preferred to perform treatment such as corona treatment, plasma treatment, low ultraviolet radiation treatment, treatment with chemical or sandblast treatment to increase the adhesive property to the resin. In this case, it is acceptable to perform no treatment.

The method of producing the heat-resistant film base-material-inserted B-stage resin composition sheet is not specially limited. For example, it includes a method in which a resin composition varnish is applied to one surface of the heat-resistant film base material, the applied varnish is B-staged by drying, then the above resin composition varnish is again applied to the other surface opposite to the above surface and the applied varnish is dried to form B-stage resin composition layers on both the surfaces of the heat-resistant film, a method in which a resin composition varnish is applied to one surface of the heat-resistant film base material, the applied varnish is B-staged by drying and then a B-stage resin composition sheet with a release film is laminate-bonded to the other surface opposite to the above surface, and a method in which B-stage resin composition sheets with release films are disposed on both surfaces of the heat-resistant film, one sheet on one surface, and these materials are bonded to each other by lamination at once. The heat-resistant film base-material-inserted B-staged resin composition sheet having the B-stage resin composition layers formed on both surfaces is produced by the above methods or the like. The production method is not limited to the above methods.

When the B-stage resin composition layer is attached to the heat-resistant film, the method therefor can be selected from known methods. For example, the resin composition is directly applied to the heat-resistant film with a roll coater or the like, and then dried to B-stage the resin composition. Otherwise, it is applied to a release film and then dried to B-stage the applied resin composition, then the heat-resistant film is disposed on the resin composition side and the components are pressure-bonded with a heating and pressure roll to form an integrated release-film-attached B-stage resin composition sheet. In this case, a small amount of solvent may remain in the resin composition. The thickness of the resin composition is not specially limited, while it is generally 5 to 100 $\mu$m, preferably 6 to 50 $\mu$m, more preferably 7 to 20 $\mu$m. The above thickness is properly selected depending upon the thickness and copper survival rate of a copper foil of an internal layer board to be used for lamination and the roughness of a copper foil to be used as an external layer. For example, when the thickness of the copper foil of the internal layer board is 12 $\mu$m and the copper survival rate is 50%, the thickness of the resin layer on the heat-resistant film is 6 $\mu$m or more, for example 10 $\mu$m. Further, the resin layer is formed such that it has a thickness taller than tops of convex portions of the copper foil as an external layer.

The resin compositions to be bonded to the heat-resistant film can be selected from known resin compositions. In this case, it is preferred to treat the heat-resistant film by a known surface treatment in view of adhesiveness. Surface roughness due to the treatment is not specially limited, while it is preferably 0.1 to 5 μm. In this case, roughness is formed according to the thickness of a heat-resistant film to be used and the roughness is adjusted so as not to exceed the thickness of the heat-resistant film. By using the heat-resistant film, there can be produced a multilayer printed wiring board excellent in insulating properties in the Z direction and reliability such as migration resistance.

The resin layers on both the surface of the heat-resistant film may have the same thickness or different thickness. For example, when the resin layer on an external layer side has a thickness of 5 to 10 μm and the resin layer to be attached on an internal layer side has a thickness of 10 to 100 μm, the total thickness can become small. In this case, the thickness of the resin layer on the external layer side is adjusted such that roughness of metal foil do not reach to the heat-resistant film and the thickness of the resin layer on the internal layer side is adjusted such that an internal layer copper foil is not in contact with the heat-resistant film. When an internal layer board having IVH (interstitial via hole) is used, depending upon the diameter of IVH, the number of IVH and the thickness of the internal layer board and further depending upon the copper survival ratio of the internal layer board, a resin attached amount (thickness) on the internal layer board side is increased up to an amount sufficient for burying IVH and a circuit after laminate-molding such that the heat-resistant film is not in contact with the internal layer board circuit. The thickness of the resin layer on the internal layer side is preferably 10 to 100 μm and it is properly selected depending upon the diameter of IVH, the number of IVH and the survival ratio of circuit copper as required. In this case, the thickness of the resin layer on the metal foil side from tops of copper foil convex portions is preferably 3 to 15 μm, more preferably 5 to 10 μm, for decreasing the total thickness.

Multilayer formation is carried out by using the heat-resistant film base-material-inserted B-stage resin composition sheet for lamination, provided by the present invention, as follows. An internal layer board having conductor circuits formed is prepared by using a copper-clad laminate or a heat-resistant film base-material-reinforced copper-clad sheet and a known surface treatment is provided to the conductor. Otherwise, circuit boards having roughened foils on both surfaces for internal layer are prepared. The above heat-resistant film base-material-inserted B-stage resin composition sheets are disposed on front and reverse surfaces of the above internal layer board or between the circuit boards. Then, the resultant set is laminate-molded or laminated under heat and pressure, preferably in vacuum, according to a known method to cure the resin composition. In an additive process, curing treatment is carried out to attain such a cured degree that allows roughening with a roughening solution, then the metal foils or release films are removed, the resultant surfaces are roughened with a roughening solution to obtain intended concave and convex portions, and then electroless plating and/or electroplating are carried out. In a subtractive process, circuits are formed while retaining the metal foils to obtain a printed wiring board.

When release films are attached to both surfaces of the heat-resistant film base-material-inserted B-stage resin composition sheet of the present invention, the release films are removed and then the resultant B-stage resin composition sheet is disposed on the internal layer board. Otherwise, the release film on one surface is removed and then the resultant B-stage resin composition sheet is disposed on the internal layer board. Then, the resultant set is laminate-bonded with a heating roll under heat and pressure, the release film on the other surface is removed, an internal layer board or a metal foil is disposed thereon and the resultant set is laminate-molded.

The metal foil to be used is not specially limited. Specific examples thereof include aluminum foil, copper foil and nickel foil. Copper foil is preferably used. Generally a metal foil having roughness is preferably used in view of an increase in adhesive strength. The thickness of the metal foil is not specially limited. Generally, it is 3 to 35 μm.

The laminate-molding conditions for multilayer formation are not specially limited. Generally, the temperature therefor is 100 to 250° C., the pressure therefor is 5 to 50 kgf/cm$^2$ and the time therefor is 0.5 to 3 hours. Further, the laminate-molding is preferably carried out in vacuum. A device can be selected from known devices such as a vacuum laminater press and a general multistage vacuum press. In the case of the vacuum laminater press, when curing is insufficient, post-curing is carried out with an oven or the like.

The release film used in the present invention is not specially limited. Specifically, it can be selected from known films such as a polyethylene terephthalate (PET) film, a polypropylene film, a poly-4-methylpentene-1 film and a fluororesin film. These films are preferably treated by release agent treatment or antistatic treatment before use. Further, a release film having roughness formed on a surface to be applied can be used. The roughness of the surface to which the resin is to be attached is not specially limited. The surface preferably has an average roughness Rz of 1 to 12 μm, more preferably 2 to 10 μm. The thickness of the release film is not specially limited. It is generally 15 to 100 μm, preferably 20 to 50 μm.

According to the present invention 2, the B-stage resin composition sheet using a heat-resistant film as a base material, provided by the present invention, is used as an adhesive sheet for producing a multilayer printed wiring board by sequentially stacking a conductor circuit and an interlayer resin insulating layer on an internal layer substrate according to an additive process.

The above heat-resistant film base-material-inserted B-stage resin composition sheet which is to be bonded to the internal layer substrate is a product in which resin composition layers having no tackiness are formed on both surfaces of the heat-resistant film or a heat-resistant film base-material-inserted release-sheet-attached B-stage resin composition sheet having a structure in which a release film is attached to a resin composition layer surface having tackiness. Preferably, it has a structure in which a 5 to 20 μm thick resin composition layer for an additive process is bonded to at least one surface of the heat-resistant film. When the insulating layer thickness after molding is adjusted to 20 to 30 μm, a heat-resistant film having a thickness of 4 to 20 μm is preferably used.

Further, the insulating layer for an additive process formed on the at least one surface of the heat-resistant film base-material-inserted B-stage resin composition sheet contains a resin component which, when the sheet is roughened with a roughening solution after curing treatment, is slightly soluble in the roughening solution and a component which is soluble in the roughening solution. It is preferred to use a curable resin composition containing, as an essential component, a resin composition containing (a) a polyfunctional cyanate ester monomer and/or a polyfunctional cyanate ester prepolymer in an amount of 100 parts by weight, (b)

an epoxy resin which is liquid at room temperature in an amount of 15 to 500 parts by weight, and (c) a heat-curing catalyst in an amount ratio of 0.005 to 10 parts by weight per 100 parts by weight of (a)+(b), as the slightly-soluble resin component for increasing heat resistance, reliability and the like. When the above curable resin composition contains, as essential components, at least two components selected from the group of three components consisting of a butadiene-containing resin and an organic powder as the component soluble in the roughening agent after curing treatment and an inorganic powder, there can be obtained excellent copper adhesive strength in plating.

The B-stage resin composition layer on at least one surface of the heat-resistant film base material of the present invention 2 is a resin composition on which a circuit can be formed by an additive process and it includes generally known resin compositions such as a thermosetting type and a phtocurable and thermosetting combination type. The resin composition layer of the heat-resistant film base-material-inserted B-stage resin composition sheet is not specially limited and it can be selected from generally known ones. The above resin composition layer contains a component soluble in a roughening solution, when subjected to curing treatment, and a resin component slightly soluble in a roughening solution. The soluble component is homogeneously dispersed in the slightly-soluble resin component. Here, the meanings of the term "soluble" and the term "slightly soluble" used in the present invention are as follows. In cases of immersions in the same roughening solution for the same period of time after curing treatment, a component which has a relatively fast rate of dissolution is expressed as "soluble" and a component which has a relatively slow rate of dissolution is expressed as "slightly soluble".

The soluble resin in the present invention can be selected from generally known soluble resins. This resin is a resin which is soluble in a solvent or a liquid resin. It is incorporated in the slightly-soluble resin. It is not specially limited. Specifically, it includes known ones such as polybutadiene rubber, acrylonitrile-butadiene rubber, epoxidized compounds, maleinized compounds, imidized compounds, carboxyl group-containing compounds and (meth)acrylated compounds of these, and styrene-butadiene rubber. Particularly, resins having a butadiene skeleton in a molecule are preferably used in view of the solubility in a roughening solution or electric characteristics. Further, a resin containing a functional group is preferred as compared with a nonfunctional resin since it reacts with other unreacted resin functional groups in post-curing treatment to undergo crosslinking and improve characteristics.

The soluble organic powder in the present invention is not specially limited and it includes thermosetting resin powders and thermoplastic resin powders. It is not specially limited so long as the rate of dissolution thereof is faster than that of a curing-treated slightly-soluble resin when they are immersed in a roughening solution. The shape of the organic powder includes a spherical shape, a broken amorphous shape, a needle shape and the like. Organic powders having these shapes can be used in combination. An organic powder having a spherical shape and an organic powder having a broken shape are preferably used. The particle diameter thereof is not specially limited, while it has preferably an average particle diameter of 0.1 to 10 $\mu$m, more preferably 0.2 to 5 $\mu$m. It is preferred to use an organic powder having a large particle diameter and an organic powder having a small particle diameter in combination. In this case, when a release film having surface roughness is used, an organic powder having a maximum particle diameter smaller than a resin layer thickness is used. For example, when an applied resin layer has a thickness of 7 $\mu$m from tops of convex portions of the release film, the maximum particle diameter of the powder is 7 $\mu$m or less, preferably 6 $\mu$m or less such that particles are not exposed from the surface of the resin after application. The average particle diameter in this case is 6 $\mu$m or less.

Specific examples thereof include powders of an epoxy resin, a polyimide resin, a polyphenylene ether resin, a polyolefine resin, a silicon resin, a phenol resin, acrylic rubber, polystyrene, MBS rubber, ABS, and the like, and multiple structure (core-shell) rubber powders of these. These powders may be used alone or in combination as required.

The inorganic powder in the present invention 2 is not specially limited. Examples thereof include aluminum compounds such as alumina and aluminum hydroxide; calcium compounds such as calcium carbonate; magnesium compounds such as magnesia; and silica compounds such as silica and zeolite. These may be used alone or in combination.

As the slightly-soluble resin used in the present invention 2, known slightly-soluble resins such as thermosetting resins and photosensitive resins may be used alone or in combination. The slightly-soluble resin is not specially limited. Specific examples thereof include an epoxy resin, a polyimide resin, a polyfunctional cyanate ester resin, a maleimide resin, a double-bond-addition polyphenylene ether resin, a polyphenylene ether resin, a polyolefine resin, epoxy acrylate, an unsaturated-group-containing polycarboxylic acid resin and a polyfunctional (meth)acrylate. Further, known brominated compounds and phosphorus-containing compounds of these can be used. Of these, the polyfunctional cyanate ester resin is preferred in view of migration resistance, heat resistance, and heat resistance after moisture absorption. Particularly, it is preferred to use a thermosetting resin composition containing, as an essential component, a resin composition containing (a) a polyfunctional cyanate ester monomer and/or a polyfunctional cyanate ester prepolymer in an amount of 100 parts by weight, (b) an epoxy resin which is liquid at room temperature in an amount of 15 to 500 parts, and (c) a heat-curing catalyst in an amount ratio of 0.005 to 10 parts by weight per 100 parts by weight of (a)+(b).

The total amount of the soluble resin, the organic powder and the inorganic powder which are homogeneously dispersed in the resin composition of the present invention 2 is not specially limited, while it is preferably 3 to 50% by weight, more preferably 5 to 35% by weight, based on the whole. At least two components of the above three components are used. The diameters of these components are preferably different rather than the same. When the diameters are different, the shape of roughness becomes more complicate, which increase an anchor effect. Therefore, a resin composition layer excellent in copper plating adhesive strength can be obtained.

The method of producing the heat-resistant film base-material-inserted B-stage resin composition sheet of the present invention 2 is not specially limited. It is produced by a method in which a known adhesive for a heat-resistant film is applied to both surfaces of the heat-resistant film base material and then dried to B-stage the adhesive, and a B-stage resin composition sheet bonded to a release film is laminate-bonded to one surface of the resultant heat-resistant film, a method in which a known adhesive for a heat-resistant film is applied to one surface of the heat-resistant film base material and then dried to B-stage the adhesive and then a release-film-attached B-stage resin composition sheet is laminate-bonded to the other surface of the heat-resistant film base material, or other methods. The resin layers on both the surfaces of the heat-resistant film base material may have the same thickness. Further, generally, the resin composition layer for an additive process is made thin and the resin layer used for lamination to an internal layer board is made thick. The production method is not specially limited to the above methods.

In the present invention 2, when a varnish or the like is applied to a release film and then dried to B-stage it, the release film to be used is selected from known release films. A surface of the release film may be rough or smooth. The roughness of a surface to which the resin is to be attached is not specially limited. It preferably has an average roughness Rz of 1 to 10 μm, more preferably 2 to 7 μm. This is because, when the roughness before roughening is large, the roughening time is short and penetration of water content is small so that swelling of a plated copper layer due to heating can be decreased. The thickness of the release film is not specially limited, while a release film having a thickness of 15 to 50 μm is generally used.

When the B-stage resin composition layer is attached to the release film, the method therefor can be selected from known methods. For example, the resin composition is directly applied to the release film with a roll and then dried to B-stage the composition. In another method, the resin composition is directly applied to the release film and then dried to B-stage the composition, the thus-obtained release film with the B-stage resin composition is disposed on each surface of the heat-resistant film and the resultant set is pressure-bonded with a heating and pressure roll, to prepare an integrated release-film-attached B-stage resin composition sheet. In this case, a small amount of a solvent may remain in the resin composition. The thickness of the resin composition is not specially limited, while it is generally 3 to 100 μm, preferably 4 to 50 μm, more preferably 5 to 20 μm from tops of convex portions of a metal foil. The above thickness of the resin composition together with the thickness of the heat-resistant film is properly selected depending upon an intended insulating layer thickness. The above thickness is set such that it is sufficient for making roughness enough for securing adhesive strength to plated copper.

In the present invention 2, in the case of multilayer formation, an internal board obtained by forming a conductor circuit in a copper-clad laminate or a heat-resistant film base-material-reinforced copper-clad sheet is prepared and the conductor is treated by known surface treatment. Otherwise, a circuit board for internal layer which board uses roughened foils on both surfaces is prepared. The above heat-resistant film base-material-inserted release-film-attached B-stage resin composition sheets are disposed on front and reverse surfaces of the above internal layer board. Then, the resultant set was laminate-molded or laminated under heat and pressure preferably in vacuum according to a known method, to perform curing treatment and to obtain a curing degree which allows roughening with a roughening solution. After the laminate-molding or lamination, the release films are removed. Of course, there can be employed a method in which the heat-resistant film base-material-inserted release-film-attached B-stage resin composition sheet is laminate-bonded to an internal layer board, the release film of an external layer is separated and then a metal foil having surface roughness is disposed and the resultant set is laminate-molded. The metal foil used in the above case is selected from known metal foils such as an aluminum foil, a copper foil and a nickel foil. The surface roughness degree of the metal foil may be the same as the above degree of the release film.

Curing treatment laminate-molding conditions in multilayer formation are the same as those of the present invention 1.

After the metal foils or release films of the external layers of the metal-foil-clad or release-film-clad board obtained in the present invention 2 are removed, the resin layers are roughened with an acid or an oxidizer by a known method. The acid to be used includes sulfuric acid, hydrochloric acid, nitric acid, phosphoric acid and formic acid. The oxidizer includes sodium permanganate, potassium permanganate, chromic acid and chrome sulfuric acid. The acid and the oxidizer shall not be limited to these. Before the above treatment, a known swelling liquid is used as required. After the treatment, neutralization is carried out with a neutralization liquid. The average roughness of a roughened surface formed by above roughening treatment is 0.1 to 10 μm, preferably 0.2 to 5 μm, as an average roughness Rz, besides the roughness of the metal foil. The total roughness of the roughness of the metal foil or release film and the roughness formed by the roughening treatment is generally 3 to 15 μm, preferably 5 to 12 μm, as an average roughness RZ.

The curable resin composition in the present invention 2 contains at least two components selected from the group consisting of a butadiene-containing resin, an organic powder and an inorganic powder, small concave and convex shapes are present in roughened concave portions even when the average roughness is not very high. Therefore, when the resin composition is plated with copper, the adhesive strength becomes high. When only one component is contained, the roughness does not become a complication so that it is difficult to obtain high copper adhesive strength.

Thereafter, electroless plating, thickening electroless plating, deposition, sputtering, etc., are carried out by a semi-additive process or a full-additive process. Generally, electroplating is carried out to thicken a conductor. When a produced printed wiring board which still retains a curing degree that allows roughening with a roughening solution, it is poor in heat resistance and reliability and can not be used as a high-density printed wiring board, although it depends upon the constitution of the resin composition. Therefore, post-curing is generally carried out before forming a circuit. The post-curing is carried out at a temperature of 100 to 250° C. for 30 minutes to 5 hours, although these conditions differ depending upon the constitution of the resin composition. Then, a circuit is formed by a known method, thereby producing a printed wiring board. Buildup is carried out by repeating the same steps sequentially, to form a multilayer structure. Of course, in accordance with the constitution of the resin composition, it is possible to cure the resin composition in advance and then carry out roughening.

The above base-material-inserted B-stage resin composition sheet can be used also as a B-stage resin composition sheet for lamination used for a general copper-clad laminate or a multilayer board. It is also possible to carry out lamination by using copper foils after the release films are removed and then produce a printed wiring board by a subtractive process.

The present invention 2 further provides a heat-resistant film base-material-inserted B-stage resin composition sheet for an additive process in which a metal foil attached to one surface of a B-stage resin composition for lamination has roughness on a metal foil surface on the resin composition side.

The metal foil having roughness on a surface used in the present invention 2 is not specially limited. Specifically, it includes an aluminum foil, a copper foil, a nickel foil and the like. The roughness of the surface, to which the resin is to be attached, is not specially limited. It has preferably an average roughness Rz of 1 to 10 μm, more preferably 2 to 7 μm. This is because, when the roughness before roughening is large, the roughening time is short and penetration of water content is small so that swelling of a plated copper layer due to heating can be decreased.

The thickness of the metal foil is not specially limited, while a small thickness is better in view of subsequent removal of the metal foil by etching or the like. It is preferably 9 to 20 μm. Of course, even when a metal foil having no roughness is used, it is possible to obtain high copper plating adhesive strength by making a roughening time longer. However, a shorter roughening treatment time is preferred in view of water absorption or the like.

When B-stage resin composition layer is attached to the metal foil, the method therefor can be selected from known methods. For example, the resin composition is directly applied to the metal foil with a roll and then dried to B-stage the resin composition. Otherwise, the resin composition is applied to a release film and then dried to B-stage the resin composition, then the metal foil is disposed on the resin composition side and the resultant set is pressure-bonded with a heating and pressure roll, to prepare an integrated metal-foil-attached B-stage resin composition sheet. In this case, a small amount of a solvent may remain in the resin composition. The thickness of the resin composition is not specially limited, while it is generally 3 to 100 μm, preferably 4 to 50 μm, more preferably 5 to 20 μm from tops of convex portions of the metal foil. The above thickness of the resin composition together with the thickness of the heat-resistant film is properly selected depending upon an intended insulating layer thickness. The thickness is set such that it is sufficient for making roughness enough for securing adhesive strength to plated copper.

By using the heat-resistant film, there can be produced a multilayer printed wiring board which is excellent in insulating properties in the Z direction and is excellent in reliability such as migration resistance since the heat-resistant film stops plating adherence of subsequent electroless copper plating.

The present invention 2 further provides a multilayer printed wiring board which is produced by stacking a conductor circuit and an interlayer resin insulating layer on a substrate sequentially, wherein a heat-resistant film layer is inserted in the stacked insulating layer.

Further, the present invention 2 provides a multilayer printed wiring board according to the above, wherein the conductor circuit is formed by an additive process.

The above multilayer printed wiring board is a thin-type multilayer printed wiring board which is produced by stacking a conductor circuit and an interlayer resin insulating layer on a internal layer substrate sequentially and using a subtractive process or an additive process.

The method of producing the multilayer printed wiring board of the present invention 2 is not specially limited. Examples thereof are as follows.

a. a method in which a so-called metal-foil-attached or release-film-attached B-stage resin composition sheet, in which a heat-resistant film-inserted B-stage resin composition layer is attached to a metal foil or a release film, is used for buildup lamination.

b. a method in which a varnish is applied to a surface of an internal layer substrate and dried to B-stage the varnish, a heat-resistant film is disposed on the above surface, a metal-foil-attached or release-film-attached B-stage resin composition sheet containing no substrate or a prepreg is disposed thereon, a metal foil is optionally disposed as required, and lamination is carried out.

c. a method in which a heat-resistant film, to one surface or both surfaces of which a B-stage resin composition layer for lamination is attached, is placed on an internal layer substrate and a metal-foil-attached or release-film attached B-stage resin composition sheet containing no substrate or a prepreg is disposed thereon, a metal foil is disposed as required, and lamination is carried out.

Further, circuits can be made by a subtractive process or an additive process, and other known buildup methods can be also used.

When the B-stage resin composition for an additive process has a curing degree which allows roughening and is directly used to prepare a printed wiring board, the obtained printed wiring board is poor in heat resistance and reliability and can not be used as a high-density printed wiring board although it depends upon the constitution of the resin composition. Therefore, post-curing is generally carried out before forming a circuit. The post-curing is carried out at a temperature of 60 to 250° C. for 30 minutes to 5 hours, although these conditions differ depending upon the constitution of the resin composition. Then, a circuit is formed by a known method, thereby producing a printed wiring board. Buildup is carried out by repeating the same steps sequentially, to form a multilayer structure. Of course, in accordance with the constitution of the resin composition, it is possible to cure the resin composition in advance and then carry out roughening. When a multilayer board is produced by a subtractive process, the resin layer is completely cured or almost completely cured at the time of lamination such that respective properties can be retained.

When the resin layer on at least the metal foil or release film side of the heat-resistant film base-material-inserted metal-foil-attached or release-film-attached B-stage resin composition sheet is an insulating layer for an additive process, this insulating layer contains a resin component which, when the layer is roughened with a roughening solution after curing treatment, is slightly soluble in the roughening solution and a component which is soluble in the roughening solution. As the slightly-soluble resin component, it is preferred to use a curable resin composition containing, as an essential component, a resin composition composed of (a) a polyfunctional cyanate ester monomer and/or a polyfunctional cyanate ester prepolymer in an amount of 100 parts by weight, (b) an epoxy resin which is liquid at room temperature in an amount of 15 to 500 parts by weight, and (c) a heat-curing catalyst in an amount ratio of 0.0 05 to 10 parts by weight per 100 parts by weight of (a)+(b), in view of increases in heat resistance, reliability, etc. When the above curable resin composition contains, as essential components, at least two components selected from the group of three components consisting of a butadiene-containing resin and an organic powder as the component which is soluble in the roughening solution after curing treatment and an inorganic powder, there can be obtained a B-stage resin composition sheet which is also excellent in plating copper adhesive strength.

Further, since the above base-material-inserted metal-foil or release-film-attached B-stage resin composition sheet includes the heat-resistant film base material so that a printed wiring board obtained by carrying out buildup using a particularly thin internal layer board is high in mechanical strength and small in warp and distortion and is excellent in molding thickness at the time of lamination, as compared with a printed wiring board using a conventional B-stage resin composition sheet including no base material. The above printed wiring board is suitable for a thin-type high-density printed wiring board for a subtractive process or additive process. Further, the heat-resistant film interrupts the Z direction so that the above printed wiring board is high in insulating reliability particularly in the Z direction and very excellent in migration resistance.

The resin composition layer bonded to the metal foil or the release film of the heat-resistant film base-material-inserted metal-foil or release-film-attached B-stage resin composition sheet to be used for an external side, is made of a resin composition which allows a circuit to be formed by a subtractive process or an additive process. The above resin composition can be selected from generally known resin compositions such as a thermosetting type resin composition and a thermosetting-and-photocurable-combination type resin composition. The resin composition layer of the heat-resistant film base-material-inserted metal-foil or release-film-attached B-stage resin composition sheet is not specially limited and can be selected from generally known resin compositions.

Concerning the resin composition layers bonded to the heat-resistant film base material, the resin composition to be used for an internal layer board side can be selected from known resin compositions. Further, the resin composition for an additive process can be used as the resin composition to be used for an internal layer board side. However, the soluble component added for an additive process is poor in resistance to chemical in many cases. Therefore, it is generally preferred to use a resin composition containing mainly the above-mentioned slightly-soluble resin. Owing to the use of the heat-resistant film base material, there can be produced a multilayer printed wiring board excellent in reliability such as migration resistance in the Z direction.

In the case of multilayer formation, an internal layer board is prepared by forming a conductor circuit in a copper-clad laminate or a heat-resistant film base-material-reinforced copper-clad sheet and a known surface treatment is provided to the conductor. Otherwise, a circuit board having roughened foils on both surfaces for internal layer is prepared. The above heat-resistant film base-material-inserted metal-foil or release-film-attached B-stage resin composition sheets are disposed on front and reverse surfaces of the above internal layer board. Then, the resultant set is laminate-molded or laminated under heat and pressure preferably in vacuum according to a known method, to carry out curing treatment until the resin composition for an additive process reaches to a curing degree which allows roughening with a roughening solution. After the laminate-molding or the lamination, the metal foil is removed by etching or the like. The release film is removed by separating. In a subtractive process, the resin compositions are cured completely or almost completely at the time of laminate-molding.

For the additive process, after the removal of the metal foils or release films on external layers of an obtained metal-foil-clad board or a release-film-attached board, the resin compositions are roughened by a known method as described before. Before this treatment, a known swelling liquid is used as required. After the treatment, neutralization is carried out with a neutralization liquid. The average roughness of a roughened surface is as described before.

This heat-resistant film base-material-inserted B-stage resin composition sheet can be used also as a B-stage resin composition sheet for lamination used for a general copper-clad laminate or a multilayer board. When the release films are used, the release films are separated, and then copper foils are disposed on the resultant surface or disposed between internal layer boards, lamination is carried out and a printed wiring board is produced by a subtractive process.

EFFECT OF THE INVENTION

According to the present invention 1, there is provided a heat-resistant film base-material-inserted B-stage resin composition sheet in which the B-stage resin composition layers are formed on both surfaces of the heat-resistant film. A printed wiring board obtained by laminate-molding using it is excellent in reliability such as migration resistance in the Z direction.

Further, when the resin composition containing (a) a polyfunctional cyanate ester monomer and/or a polyfunctional cyanate ester prepolymer in an amount of 100 parts by weight, (b) an epoxy resin which is liquid at room temperature in an amount of 15 to 500 parts by weight, and (c) a heat-curing catalyst in an amount ratio of 0.005 to 10 parts by weight per 100 parts by weight of (a)+(b) is essentially used as a resin component, there can be provided a multilayer printed wiring board which has high heat resistance and is excellent in reliability such as migration reliability and crack resistance and is also excellent in copper adhesive strength.

According to the present invention 2, there is provided a heat-resistant film base-material-inserted B-stage resin composition sheet for an additive process, which resin composition sheet has a structure in which the B-stage resin composition layers are bonded to both surfaces of the heat-resistant film, wherein the B-stage resin composition layer for an additive process is formed on at least a surface side to be used as an external layer. When the above sheet is used for buildup to obtain a multilayer printed wiring board, the obtained multilayer printed wiring board has high elastic modulus (hardness) and is excellent in warp resistance, distortion resistance and thickness accuracy and further excellent in migration resistance in the Z direction.

Further, when at least the resin composition for an additive process of the base-material-inserted metal-foil-attached B-stage resin composition uses a curable resin composition including, as an essential component, a resin composition containing (a) a polyfunctional cyanate ester monomer and/or a polyfunctional cyanate ester prepolymer in an amount of 100 parts by weight, (b) an epoxy resin which is liquid at room temperature in an amount of 15 to 500 parts by weight, and (c) a heat-curing catalyst in an amount ratio of 0.005 to 10 parts by weight per 100 parts by weight of (a)+(b), as a resin component which is slightly-soluble after curing treatment and further uses, as essential components, at least two members selected from the group of three components consisting of a butadiene-containing resin, an organic powder as a component which is soluble in a roughening solution after curing treatment and an inorganic powder, there is provided a multilayer printed wiring board having high copper plating adhesive strength and high heat resistance and having excellent reliability such as migration resistance and crack resistance.

According to the present invention 2, there is provided a heat-resistant film base-material-inserted metal-foil-attached B-stage resin composition sheet for an additive process in which the metal foil bonded to one surface of the B-stage resin composition for an additive process has roughness on a metal foil surface on the resin composition side. Accordingly, there is provided a multilayer printed wiring board which has high elastic modulus (hardness) and is excellent in warp resistance, distortion resistance and thickness accuracy and further excellent in migration resistance in the Z direction. Since the resin for an additive process is subjected to roughening treatment, an anchor effect increases, so that there is obtained a printed wiring board having high adhesive strength to copper plating.

According to the present invention 2, there is provided a multilayer printed wiring board produced by stacking a conductor circuit and an interlayer resin insulating layer on a substrate sequentially, wherein the heat-resistant film is inserted in the stacked insulating layer. Owing to the above structure, the multilayer printed wiring board is excellent in migration resistance in the Z direction.

EXAMPLES

The present invention will be concretely explained with reference to Examples and Comparative Examples hereinafter. In Examples and Comparative Examples, "part" stand for "part by weight" unless otherwise specified.

Example 1

400 Parts of 2,2-bis(4-cyanatophenyl)propane monomer was melted at 150° C. and allowed to react for 4 hours with stirring, to prepare a prepolymer having an average molecular weight of 1,900. The prepolymer was dissolved in methyl ethyl ketone, to prepare a varnish. To the varnish were added 100 parts of a bisphenol A type epoxy resin (trade name: Epikote 828, supplied by Japan epoxy resin), 150 parts of a bisphenol F type epoxy resin (trade name: EXA830LVP, supplied by Dainippon Ink And Chemicals, Incorporated) and 150 parts of a novolak type epoxy resin (trade name: DEN438, supplied by Dow Chemical) as epoxy resins liquid at room temperature, and 200 parts of a cresol novolak type epoxy resin (trade name: ESCN220F, supplied by Sumitomo Chemical Co., Ltd.) as an epoxy resin solid at room temperature. As a heat-curing catalyst, 0.3 part of iron acetylacetonate dissolved in methyl ethyl ketone was added thereto. 400 parts of talc (average particle diameter 1.8 $\mu$m, maximum particle diameter 4.2 $\mu$m) was added to the resultant mixture, and these materials were homogeneously stirred and mixed, to prepare a varnish.

The above varnish prepared from the epoxy resins liquid at room temperature, etc., was continuously applied to one surface of a 25 $\mu$m thick release PET film having a smooth surface, and the applied varnish was dried to obtain a B-stage resin layer having a gelatin time of 58 seconds and a thickness of 18 $\mu$m. At the time when the resultant film came out from a drying zone, a 20 $\mu$m thick polypropylene protective film was placed on the resin layer surface. These materials were laminated at 100° C. under a linear load of 4 kgf/cm, to prepare a release film-attached B-stage resin composition sheet. Further, the varnish prepared from the epoxy resins liquid at room temperature, etc., was continuously applied to one surface of a 25 $\mu$m thick release PET film having a smooth surface and the applied varnish was dried to form a B-stage resin layer having a gelatin time of 55 seconds and a thickness of 7 $\mu$m. At the time when the resultant film came out from a drying zone, a 20 $\mu$m thick polypropylene protective film was placed on the resin layer surface. These materials were laminated at 100° C. under a linear load of 4 kgf/cm, to prepare a release film-attached B-stage resin composition sheet. A 10 $\mu$m thick polyimide film was prepared and both surfaces thereof were treated by plasma treatment. Two kinds of the release film-attached B-stage resin composition sheets having different thickness from each other were disposed on both the plasma-treated surfaces of the polyimide film while separating each of the protective films, and these materials were continuously laminated at 90° C. under a linear load of 5 kgf/cm to integrate them, whereby heat-resistant film base-material-inserted release-film-attached B-stage resin composition sheets having a resin layer thickness of 35 $\mu$m were prepared.

Separately, circuits of a copper survival rate of 30% were formed on a BT resin copper-clad laminate having an insulating layer thickness of 0.2 mm and having 12 $\mu$m thick copper foils on both surfaces (trade name: CCL-HL830, supplied by Mitsubishi Gas Chemical Company, INC.) and then the copper foils were treated by black copper oxide treatment, to prepare an internal layer board. The above heat-resistant film base-material-inserted release-film-attached B-stage resin composition sheet was disposed on each surface of the internal layer board while separating the release film on one surface of the B-stage resin composition sheet such that the resin layer faced to the internal layer board. These materials were laminate-bonded with a heating roll at 90° C. under 5 kgf/cm, and then the release films on both the surfaces were peeled off. Electrolytic copper foils having a thickness of 12 $\mu$m and a nickel-treated shiny surface each were disposed on both the surfaces, one copper foil on one surface. The resultant set was placed in a press machine and it was laminate-molded under a vacuum of 30 mmHg or less for 2 hours at 110° C.·30 minutes+200° C.·90 minutes and 5 kgf/cm$^2$·20 minutes+20 kgf/cm$^2$·120 minutes, to obtain a multilayer board having four layers. The multilayer board had an insulation layer thickness of almost 20 $\mu$m. Each surface of the multilayer board was 1 shot irradiated directly with a carbon dioxide gas laser at an output of 12 mJ to make blind via holes having a diameter of 100 $\mu$m. The copper foils on the external surfaces were etched until the copper foils had a thickness of 4 $\mu$m each, and at the same time copper foil burrs in the blind via hole portions were removed. After desmear treatment, electroless copper plating was attached to a thickness of 0.7 $\mu$m and electrolytic copper plating was attached to a thickness of 15 $\mu$m. Then, circuits were formed by a general method. Black copper oxide treatment was carried out and then the above-prepared heat-resistant film base-material-inserted release-film-attached B-stage resin composition sheets were similarly disposed, and the resultant set was similarly processed to produce a six-layered printed wiring board. Table 1 shows results of evaluation of this printed wiring board.

Example 2

500 parts of a bisphenol A type epoxy resin (trade name: Epikote 1001, supplied by Japan epoxy resin), 450 parts of a phenol novolak type epoxy resin (trade name: DEN438, supplied by Dow Chemical), 30 parts of an imidazole type curing agent (trade name: 2E4MZ, supplied by Shikoku Corporation) and 400 parts of talc (average particle diameter 1.8 $\mu$m, maximum particle diameter 4.2 $\mu$m) were added. These materials were homogeneously dispersed with a three-roll mill, to prepare a varnish. The varnish was continuously applied to a 25 $\mu$m thick release PET film having a smooth surface and the applied varnish was dried to prepare a B-stage resin composition layer having a resin composition thickness of 23 $\mu$m and a gelation time of 65 seconds. The B-stage resin composition layer was disposed on each surface of a 4.5 $\mu$m thick wholly aromatic polyamide (aramid) film and continuously laminated with a heating roll at a temperature of 100° C. under a linear load of 5 kgf/cm, to produce heat-resistant film base-material-inserted release-film-attached B-stage resin composition sheets (FIG. 1 (1)). The insulating layer thickness thereof was approximately 50 $\mu$m.

Separately, circuits are formed on an epoxy type copper-clad laminate (trade name; CCL-EL170, supplied by Mitsubishi Gas Chemical Company, INC.) having a thickness of 0.2 mm and 12 $\mu$m thick copper foils on both surfaces and conductors were subjected to black copper oxide treatment to prepare an internal layer board. The above heat-resistant film base-material-inserted release-film-attached B-stage resin composition sheet was disposed on each surface of the internal layer board after separating the release PET film on one surface of the B-stage resin composition sheet. The resultant set was laminated with a heating roll at a temperature of 100° C. under a linear load of 5 kgf/cm, to prepare an internal layer board having the heat-resistant film base-material-inserted release-film-attached B-stage resin composition sheets attached to both the surfaces. Further, there was similarly prepared an internal layer board in which the heat-resistant film base-material-inserted release-film-attached B-stage resin composition sheet was attached to one surface of an internal layer board having conductors treated by black copper oxide treatment. The surface, to which the resin composition sheet was not attached, of the internal layer board having the resin composition sheet attached to the one surface was brought into contact with one surface of the above internal layer board having the resin composition sheets attached to both the surfaces, after the attached release films were separated. Electrolytic copper foils having a thickness of 12 μm and a nickel-treated shiny surface each were disposed on outermost external layers of the above internal layer boards, one copper foil on each external layer. The resultant set was placed in a press machine and it was laminate-molded under a vacuum of 30 mmHg or less for 2 hours at 110° C.·30 minutes+180° C.·90 minutes and 5 kgf/cm²·15 minutes+20 kgf/cm²·125 minutes, to obtain a multilayer board having six layers (FIG. 1 (2)). The insulating layer thickness between the internal layer boards was almost 30 μm. Each surface of the multilayer board was 1 shot irradiated with a carbon dioxide gas laser at an output of 12 mJ to make blind via holes having a diameter of 100 μm. The copper foils on the external surfaces were etched and dissolved until the copper foils had a thickness of 3 μm each, and at the same time copper foil burrs occurring in the hole portions were dissolved and removed. After a remaining resin layer in the bottom of each blind via hole was removed by desmear treatment, electroless copper plating was attached to a thickness of 0.7 μm and electrolytic copper plating was attached to a thickness of 15 μm. Then, circuits were formed by a general method, to produce a printed wiring board (FIG. 1 (3)). Table 1 shows results of evaluation of this printed wiring board.

Comparative Examples 1–2

The same varnishes as those obtained from the epoxy resins, etc., in Example 1 and Example 2 were used. Release-film-attached B-stage resin composition sheets were similarly obtained except that the thickness of the B-stage resin layer attached to the release film in Example 1 was changed to 21 μm and the thickness of the B-stage resin layer attached to the release film in Example 2 was changed to 50 μm, respectively. In Example 1 and 2, only these release film-attached B-stage resin composition sheets were used without the heat-resistant films used in Example 1 and 2, and the sheets were similarly laminate-molded to prepare multilayer printed wiring boards having six layers, as Comparative Examples 1 and 2. Table 1 shows results of evaluation of these printed wiring boards.

Comparative Example 3

In Example 1, a glass woven cloth having a thickness of 20 μm was impregnated with the same varnish obtained from the epoxy resins, etc., as that obtained in Example 1 and the impregnated varnish was dried to obtain a prepreg having a total thickness (glass woven cloth+resin composition layer) of 45 μm and a gelation time (170°) of 85 seconds. The prepreg was disposed on each surface of an internal layer board (BT resin copper-clad laminate). Electrolytic copper foils having a thickness of 12 μm and a nickel-treated shiny surface were disposed on both outer surfaces of the resultant board, one copper foil on one surface. The resultant set was placed in a press machine and then it was laminate-molded under the same conditions as those in Example 1 to prepare a multilayer board having four layers. Then, a multilayer printed wiring board having six layers was similarly produced. Table 1 shows results of evaluation of this printed wiring board.

Comparative Example 4

A glass woven cloth having a thickness of 27 μm was impregnated with the same varnish obtained from the epoxy resins, etc., as that obtained in Example 2 and the impregnated varnish was dried to obtain a prepreg having a total thickness (glass woven cloth+resin composition layer) of 50 μm and a gelation time (170°) of 88 seconds. The prepreg was disposed on each surface of an internal layer board (BT resin copper-clad laminate). Electrolytic copper foils having a thickness of 12 μm and a nickel-treated shiny surface were disposed on both outer surfaces of the resultant board, one copper foil on one surface. The resultant set was placed in a press machine and then it was laminate-molded under the same conditions as those in Example 2 to prepare a multilayer board having four layers. Then, a multilayer printed wiring board having six layers was similarly produced. Table 1 shows results of evaluation of this printed wiring board.

TABLE 1

| Item | Examples | | Comparative Examples | | | |
|---|---|---|---|---|---|---|
| | 1 | 2 | 1 | 2 | 3 | 4 |
| Copper adhesive strength (kgf/cm) | | | | | | |
| | 1.40 | 1.48 | 1.40 | 1.49 | 1.43 | 1.48 |
| Soldering heat resistance | | | | | | |
| | No failure | No failure | No failure | Partial swelling | Partial swelling | Partial swelling |
| Glass transition temperature DMA (° C.) | | | | | | |
| | 208 | 165 | 210 | 158 | 209 | 167 |
| Elastic modulus 25° C. (kgf/mm²) | | | | | | |
| | 1,579 | 1,378 | 995 | 791 | 1,990 | 1,899 |
| Warp · distortion (mm) | | | | | | |
| | 1.5 | 1.8 | 4.6 | 5.7 | 1.5 | 1.6 |
| Thickness variance (μm) | | | | | | |
| | 4.8 | 5.0 | 9.8 | 12.9 | — | — |

TABLE 1-continued

| | Examples | | Comparative Examples | | | |
|---|---|---|---|---|---|---|
| Item | 1 | 2 | 1 | 2 | 3 | 4 |
| Migration resistance (Ω) | | | | | | |
| Ordinary state | $5 \times 10^{13}$ | $5 \times 10^{13}$ | $6 \times 10^{13}$ | $6 \times 10^{13}$ | $7 \times 10^{13}$ | $6 \times 10^{13}$ |
| 100 hours | $5 \times 10^{11}$ | $8 \times 10^{10}$ | $6 \times 10^{10}$ | $8 \times 10^{8}$ | $6 \times 10^{9}$ | $1 \times 10^{8}$ |
| 500 hours | $3 \times 10^{11}$ | $4 \times 10^{10}$ | $<10^{8}$ | $<10^{8}$ | $<10^{8}$ | $<10^{8}$ |

<Measurement Methods>

1) Copper adhesive strength: Measured according to JIS C6481.

2) Soldering heat resistance: After pressure cooker test treatment (PCT: 121° C.·203 kPa·4 hours), a printed wiring board having six layers was immersed in solder at 260° C. for 30 seconds and then checked for failures.

3) Grass transition temperature: A plurality of sheets of each base-material-inserted B-stage resin composition sheet were stacked so as to have a thickness of about 0.8 mm and the stacked sheets were similarly laminate-molded under each lamination condition, then copper foils on external layers were etched and then the resultant laminate was measured by DMA method. In Comparative Examples 1 and 2, laminates obtained by applying a resin several times so as to have a thickness of about 0.8 mm and carrying out laminate-formation similarly were used.

4) Elastic modulus: Table 1 shows elastic modulus at 25° in the chart of DMA measured in 3).

5) Warp·distortion: A six-layered printed wiring board having a size of 250×250 mm was placed on a surface plate and a maximum value of warp or distortion was measured.

6) Thickness variance: The same six-layered printed wiring board having a size of 250×250 mm as that in 5) was measured for thickness variance at nine points, per adhesive sheet of the board, with a thickness measurement apparatus. It was represented by (maximum value−minimum value). In Example 2, the thickness variance of the adhesive sheet used between the internal layer boards was obtained by measuring its cross section.

7) Migration resistance: Copper foil portions having a size of 10×10 mm were left in the first layer and the second layer of the six-layered board of each of Examples and Comparative Examples at the same positions. 100 such copper foil portions were connected. The board was measured for insulating resistance in the insulating layer in the Z direction at 85° C.·85% RH under application of 100 VDC.

Example 3

Figure 2:
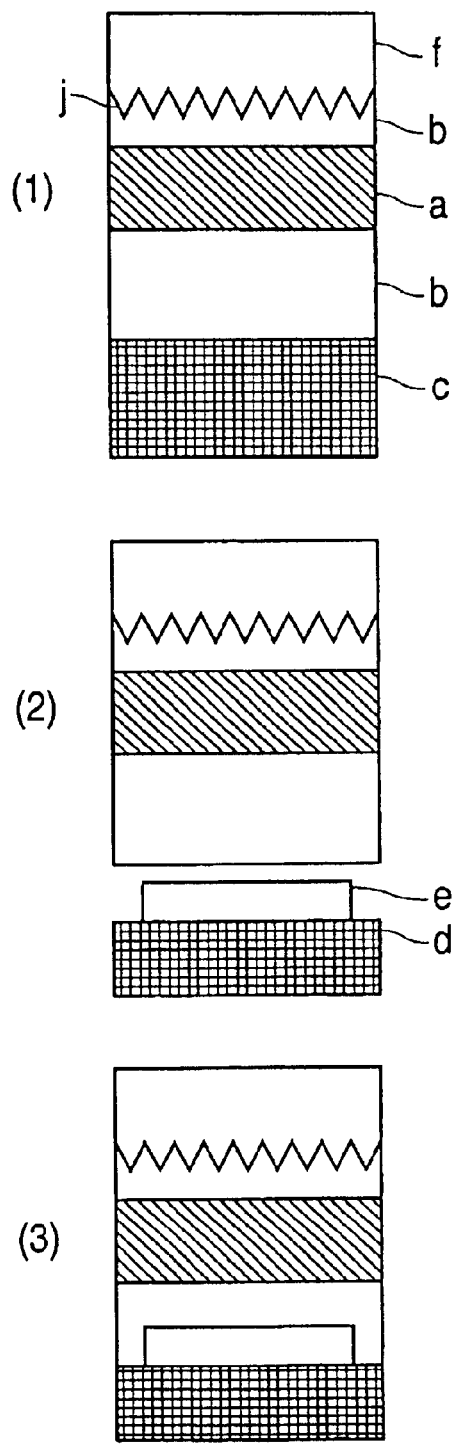
FIG. 2 is an explanatory drawing showing steps of producing a printed wiring board in Example 3.

A release-film-attached B-stage resin composition sheet was prepared in the same manner as in Example 1. Further, a varnish was prepared from epoxy resins, etc., in the same manner as in Example 1. The varnish was continuously applied to a mat surface of an electrolytic copper foil having a thickness of 12 μm and a shiny surface having a 0.5 μm thick nickel treatment, and the applied varnish was dried to form a B-stage resin layer having a gelation time of 51 seconds and a thickness, from tops of convex portions of the electrolytic copper foil, of 5 μm. At the time when the resultant copper foil came out from a drying zone, a 20 μm thick polypropylene protective film was placed on the resin layer surface. These materials were laminated at 100° C. under a linear load of 4 kgf/cm, to prepare a copper-foil-attached B-stage resin composition sheet. A polyimide film having a thickness of 12 μm was prepared and both surfaces of the polyimide film were treated by plasma treatment. The above two kinds of the B-stage resin composition sheets were disposed on both the surfaces of the polyimide film while separating each protective film. These materials were continuously laminated at 100° C. under a linear load of 5 kgf/cm to integrate them, whereby heat-resistant film base-material-inserted metal-foil-attached B-stage resin composition sheets having an insulating layer thickness of 35 μm were produced (FIG. 2 (1)).

Separately, circuits of a copper survival rate of 30% were formed on a BT resin copper-clad laminate having an insulating layer thickness of 0.2 mm and having 12 μm thick copper foils on both surfaces (trade name: CCL-HL830, supplied by Mitsubishi Gas Chemical Company, INC.) and then the copper foils were treated by black copper oxide treatment, to prepare an internal layer board. The above heat-resistant film base-material-inserted metal-foil-attached B-stage resin composition sheets were disposed on both the surfaces of the internal layer board while separating the release films such that the resin layers each faced to the internal layer board (FIG. 2 (2)). These materials were laminate-molded under a vacuum of 30 mmHg or less for 2 hours at 110° C.·30 minutes+200° C.·90 minutes and 5 kgf/cm²·20 minutes+20 kgf/cm²·120 minutes, to obtain a multilayer board having four layers (FIG. 2 (3)). The multilayer board had an insulation layer thickness of almost 25 μm. Each surface of the multilayer board was 1 shot irradiated directly with a carbon dioxide gas laser at an output of 12 mJ to make blind via holes having a diameter of 100 μm. The copper foils on the external surfaces were etched until the copper foils had a thickness of 4 μm each, and at the same time copper foil burrs in the blind via hole portions were removed. After desmear treatment, electroless copper plating was attached to a thickness of 0.5 μm and electrolytic copper plating was attached to a thickness of 15 μm. Then, circuits were formed by a general method. After black copper oxide treatment was carried out, the above-prepared heat-resistant film base-material-inserted copper-foil-attached B-stage resin composition sheets were similarly disposed, and the resultant set was similarly processed to produce a six-layered printed wiring board. Table 2 shows results of evaluation of this printed wiring board.

Example 4

A varnish was prepared from epoxy resins, etc., in the same manner as in Example 2. The varnish was applied to a release PET film and the applied varnish was dried to prepare the same B-stage resin composition layer as that prepared in Example 2. At the time when it came out from a drying zone, a 20 μm thick polypropylene protective film was placed on its resin layer surface. These materials were laminated at 100° C. under a linear load of 4 kgf/cm, to prepare a release-film-attached B-stage resin composition sheet. Further, the above varnish was continuously applied to a mat surface of the same electrolytic copper foil having a thickness of 12 μm and having a nickel-treated shiny surface as that used in Example 3, and the applied varnish was dried to form a B-stage resin layer having a gelation time of 65 seconds and a thickness, from tops of convex portions of the copper foil, of 8 μm. At the time when the resultant copper foil came out from a drying zone, a 20 μm thick polypropylene protective film was placed on the resin layer surface. These materials were laminated at 100° C. under a linear load of 4 kgf/cm, to prepare a copper-foil-attached B-stage resin composition sheet. The above B-stage resin composition sheets were disposed on both surfaces of a 4.5 μm thick wholly aromatic polyamide (aramid) film while separating each protective film. These materials were continuously laminated with a heating roll at 100° C. under a linear load of 5 kgf/cm, whereby heat-resistant film base-material-inserted copper-foil-attached B-stage resin composition sheets were produced. The insulating layer thickness thereof was almost 35 μm.

Separately, an internal layer board was prepared in the same manner as in Example 3. The above heat-resistant film base-material-inserted copper-foil-attached B-stage resin composition sheet was disposed on each surface of the internal layer board. The resultant set was placed in a press machine and then it was laminate-molded under a vacuum of 30 mmHg or less for 2 hours at 110° C.·30 minutes+180° C.·90 minutes and 5 kgf/cm$^2$·15 minutes+20 kgf/cm$^2$·125 minutes, to obtain a multilayer board having four layers. The multilayer board had an insulation layer thickness of almost 25 μm. Each copper foil surface of the multilayer board was 1 shot irradiated with a carbon dioxide gas laser at an output of 12 mJ to make blind via holes having a diameter of 100 μm. The copper foils on the external surfaces were etched until the copper foils had a thickness of 3 μm each, and at the same time copper foil burrs occurring in the blind via hole portions were dissolved and removed. A remaining resin layer in the bottom of each blind via hole was removed by desmear treatment. Then, electroless copper plating was attached to a thickness of 0.5 μm and further electrolytic copper plating was attached to a thickness of 15 μm. Circuits were formed by a general method. The above procedures of black copper oxide treatment, lamination, the formation of holes, etc., were repeated to carry out buildup, whereby a six-layered printed wiring board was obtained. Table 2 shows results of evaluation of this printed wiring board.

Comparative Examples 5–6

The same varnishes as those obtained from epoxy resins, etc., in Example 3 and Example 4 were respectively used. These varnishes were respectively applied to copper foils to form B-stage resin layers having a thickness of 35 μm each, and copper-foil-attached B-stage resin composition sheets were similarly obtained, respectively. Laminate-molding was carried out in the same manner as in Example 3 or Example 4 except that only the above copper-foil-attached B-stage resin composition sheets were used without the heat-resistant film base materials used in Example 3 and 4, whereby multilayer printed wiring boards having six layers were respectively obtained as Comparative Examples 3 and 4. Table 2 shows results of evaluation of these printed wiring boards.

Comparative Example 7

In Example 3, a glass woven cloth having a thickness of 20 μm was impregnated with the same varnish obtained from epoxy resins, etc., as that obtained in Example 3 and the impregnated varnish was dried to obtain a prepreg having a total thickness (glass woven cloth+resin composition layer) of 35 μm and a gelation time (170°) of 86 seconds. The prepreg was disposed on each surface of an internal layer board. Electrolytic copper foils having a thickness of 12 μm and a nickel-treated shiny surface were disposed on both outer surfaces or the resultant board, one copper foil on one surface. The resultant set was placed in a press machine and then it was laminate-molded under the same conditions as those in Example 3 to prepare a multilayer board having four layers. Then, a multilayer printed wiring board having six layers was similarly produced. Table 2 shows results of evaluation of this printed wiring board.

Comparative Example 8

In Example 4, a glass woven cloth having a thickness of 20 μm was impregnated with the same varnish obtained from epoxy resins, etc., as that obtained in Example 4 and the impregnated varnish was dried to obtain a prepreg having a total thickness (glass woven cloth+resin composition layer) of 35 μm and a gelation time (170°) of 92 seconds. The prepreg was disposed on each surface of an internal layer board. Electrolytic copper foils having a thickness of 12 μm and a nickel-treated shiny surface were disposed on both outer surfaces of the resultant board, one copper foil on one surface. The resultant set was placed in a press machine and then it was similarly laminate-molded to prepare a multilayer board having four layers. Then, a multilayer printed wiring board having six layers was similarly produced. Table 2 shows results of evaluation of this printed wiring board.

TABLE 2

|  | Examples | | Comparative Examples | | | |
| --- | --- | --- | --- | --- | --- | --- |
| Item | 3 | 4 | 5 | 6 | 7 | 8 |
| Copper adhesive strength (kgf/cm) | | | | | | |
|  | 1.39 | 1.48 | 1.40 | 1.48 | 1.40 | 1.47 |
| Soldering heat resistance | | | | | | |
|  | No failure | No failure | No failure | Partial swelling | Partial swelling | Partial swelling |
| Glass transition temperature DMA (° C.) | | | | | | |
|  | 209 | 166 | 210 | 168 | 209 | 167 |

TABLE 2-continued

| Item | Examples | | Comparative Examples | | | |
|---|---|---|---|---|---|---|
| | 3 | 4 | 5 | 6 | 7 | 8 |
| Elastic modulus 25° C. (kgf/mm$^2$) | | | | | | |
| | 1,663 | 1,520 | 1,022 | 938 | 1,915 | 1,870 |
| Warp · distortion (mm) | | | | | | |
| | 1.1 | 1.4 | 3.6 | 4.0 | 1.4 | 1.5 |
| Thickness variance (μm) | | | | | | |
| | 3.5 | 4.3 | 7.5 | 8.3 | — | — |
| Migration resistance (Ω) | | | | | | |
| Ordinary state | 6 × 10$^{13}$ | 6 × 10$^{13}$ | 6 × 10$^{13}$ | 5 × 10$^{13}$ | 5 × 10$^{13}$ | 6 × 10$^{13}$ |
| 100 hours | 4 × 10$^{11}$ | 5 × 10$^{10}$ | 3 × 10$^{10}$ | 5 × 10$^8$ | 5 × 10$^9$ | 1 × 10$^8$ |
| 700 hours | 1 × 10$^{11}$ | 2 × 10$^{10}$ | <10$^8$ | <10$^8$ | <10$^8$ | <10$^8$ |

Example 5

400 Parts of 2,2-bis(4-cyanatophenyl)propane monomer was melted at 150° C. and allowed to react for 4 hours with stirring, to prepare a prepolymer having an average molecular weight of 1,900. The prepolymer was dissolved in methyl ethyl ketone, to prepare a varnish. To the varnish were added 100 parts of a bisphenol A type epoxy resin (trade name: Epikote 828, supplied by Japan epoxy resin), 50 parts of a bisphenol F type epoxy resin (trade name: EXA830LVP, supplied by Dainippon Ink And Chemicals, Incorporated) and 50 parts of a novolak type epoxy resin (trade name: DEN438, supplied by Dow Chemical) as epoxy resins liquid at room temperature, and 300 parts of a bisphenol A type epoxy resin (trade name: Epikote 1001, supplied by Japan epoxy resin) and 100 parts of a cresol novolak type epoxy resin (trade name: ESCN220F, supplied by Sumitomo Chemical Co., Ltd.) as epoxy resins solid at room temperature. As a heat-curing catalyst, 0.3 part of iron acetylacetonate dissolved in methyl ethyl ketone was added to the mixture. 100 parts of a liquid epoxidized polybutadiene resin (trade name: E-1000-8.0, supplied by NIPPON PETROCHEMICALS CO., LTD) and 50 parts of an epoxy-group-modified acrylic multilayer structure organic powder (trade name: Staphyloid IM-203, average particle diameter 0.2 μm, maximum particle diameter 0.5 μm) were added to the resultant mixture, and these materials were homogeneously stirred and mixed, to prepare a varnish.

The above varnish prepared from the epoxy resins, etc., was continuously applied to a 25 μm thick PET film having a roughened surface treated with a release agent (roughness 3.7~6.0 μm, average roughness Rz: 4.5 μm), and the applied varnish was dried to obtain a B-stage resin composition layer having a thickness, from top of a maximum convex portion of the release film, of 5.9 μm and a gelatin time of 46 seconds at 170° C. At the time when the resultant film came out from a drying zone, a 20 μm thick protective polypropylene film was placed on the resin layer surface. These materials were laminated at 100° C. under a linear load of 4 kgf/cm, to prepare a release film-attached B-stage resin composition sheet A.

Further, 700 parts of a bisphenol A type epoxy resin (trade name: Epikote 1001, supplied by Japan epoxy resin), 140 parts of a bisphenol F type epoxy resin (trade name: EXA830LVP, supplied by Dainippon Ink And Chemicals, Incorporated) and 160 parts of a cresol novolak type epoxy resin (trade name: ESCN220F, supplied by Sumitomo Chemical Co., Ltd.) were added to 1,000 parts, solid content, of the above varnish obtained from the prepolymer of the propane monomer. As a heat-curing catalyst, 0.5 part of iron acetylacetonate dissolved in methyl ethyl ketone was added to the mixture. 150 parts of a liquid epoxidized polybutadiene resin (trade name: E-1800-8.0, supplied by NIPPON PETROCHEMICALS CO., LTD), 80 parts of an epoxy-group-modified acrylic multilayer structure powder (trade name: Staphyloid IM-203, average particle diameter 0.2 μm, maximum particle diameter 0.5 μm) and 300 parts of talc (average particle diameter 1.8 μm, maximum particle diameter 4.2 μm) were added to the resultant mixture, and these materials were homogeneously stirred and mixed, to prepare a varnish C.

This varnish C was continuously applied to one surface of a 25 μ thick release PET film having smooth surfaces, and the applied varnish was dried to obtain a B-stage resin layer having a gelatin time of 55 seconds and a thickness of 23 μm. At the time when the resultant film came out from a drying zone, a 20 μm thick polypropylene protective film was placed on the resin layer surface. These materials were laminated at 100° C. under a linear load of 4 kgf/cm, to prepare a release film-attached B-stage resin composition sheet B. A 12 μm thick polyimide film was prepared and both surfaces thereof were treated by plasma treatment. The release film-attached B-stage resin composition sheet B was disposed on one surface of the polyimide film while separating the protective film, and the above release film-attached B-stage resin composition sheet A was disposed on the other surface of the polyimide film while separating the protective film. These materials were continuously laminated at 100° C. under a linear load of 5 kgf/cm to integrate them, whereby heat-resistant film base-material-inserted release-film-attached B-stage resin composition sheets were prepared (FIG. 3 (1)). The insulating layer thickness from tops of convex portions of the copper foil was about 41 μm.

Separately, circuits were formed on a BT resin copper-clad laminate having an insulating layer thickness of 0.2 mm and having 12 μm thick copper foils on both surfaces (trade name: CCL-HL830, supplied by Mitsubishi Gas Chemical Company, INC.) and then the copper foils were treated by black copper oxide treatment, to prepare an internal layer board. The above heat-resistant film base-material-inserted release-film-attached B-stage resin composition sheets were placed on both surfaces of the internal layer board such that the resin layer of each B-stage resin composition sheet faced to the internal layer board. The resultant set was placed in a press machine. The temperature was increased from room temperature to 170° C. over 25 minutes and the pressure was set at 15 kgf/cm² from the beginning. The above set was maintained at a vacuum degree of 0.5 Torr at 170° C. for 30 minutes. Then it was allowed to cool and then taken out to obtain a multilayer board having four layers. The release films having the roughness on the external surfaces were removed. Then, each surface was 1 shot irradiated with a carbon dioxide gas laser at an output of 12 mJ to form blind via holes having a diameter of 100 µm each. The multilayer board was swollen with a potassium permanganate type desmear solution (supplied by Nippon MacDermid Co., Inc.), desmear (dissolution) was carried out and neutralization was carried out, to attain concave portions of 3.4~5.0 µm from the resin surface (average roughness Rz: 4.2 µm) and a total roughness, from the external layer, of 6.7~10.9 µm (average roughness Rz: 8.4 µm). At the same time, a remaining resin layer in the bottom of each blind via hole was dissolved and removed. Then, an electroless copper plating layer having a thickness of 0.7 µm was attached to each of the above roughened surfaces and an electrolytic copper plating layer having a thickness of 25 µm was further attached thereto. The board was placed in a heating furnace, and temperature was gradually increased from 100° C. to 150° C. over 30 minutes. Further, the temperature was gradually increased up and the board was cured under heat at 200° C. for 60 minutes. The thickness of the insulating layer was measured in a cross section and it was almost 30 µm. The resultant board was used to form a copper conductor circuit by a semi-additive process and the surface of the conductor circuit was treated by black copper oxide treatment. The above procedures were repeated to produce a multilayer printed wiring board having six layers. Table 3 shows results of evaluation of this printed wiring board.

Example 6

500 parts of a bisphenol A type epoxy resin (trade name: Epikote 1001, supplied by Japan epoxy resin), 500 parts of a phenol novolak type epoxy resin (trade name: DEN438, supplied by Dow Chemical), 30 parts of an imidazole type curing agent (trade name: 2PHZ, supplied by Shikoku Corporation), 50 parts of a carboxyl-group-modified acrylic multilayer structure powder (trade name: Staphyloid IM-301, average particle diameter 0.2 µm, maximum particle diameter 0.5 µm), 40 parts of a finely-pulverized silica (average particle diameter 2.4 µm, maximum particle diameter 5.0 µm) and 30 parts of acrylonitrile-butadiene rubber (trade name: Nipol 1031, supplied by ZEON Corporation) were dissolved in methyl ethyl ketone, to obtain a solution. The solution was homogeneously dispersed with a three-roll mill to prepare a varnish D. The varnish D was continuously applied to one surface of a 25 µm thick release PET film having smooth surfaces, and the applied varnish was dried to prepare a release-film-attached B-stage resin composition sheet A having a 15 µm thick resin composition layer (gelation time at 170° C., 67 seconds). At the time when it came out from a drying zone, a 15 µm thick protective polypropylene film was placed on its resin layer surface. These materials were continuously laminated at 100° C. under a linear load of 5 kgf/cm and then rolled up.

Further, 500 parts of a bisphenol A type epoxy resin (trade name: Epikote 1001, supplied by Japan epoxy resin), 450 parts of a phenol novolak type epoxy resin (trade name: DEN438, supplied by Dow Chemical), 30 parts of an imidazole type curing agent (trade name: 2E4MZ, supplied by Shikoku Corporation), 150 parts of a carboxyl-group-modified acrylic multilayer structure organic powder (trade name: Staphyloid IM-301, average particle diameter 0.2 µm) were added and these materials were homogeneously dispersed with a three-roll mill, to prepare a varnish. The varnish was continuously applied to a 25 µm thick release PET film having smooth surfaces, and the applied varnish was dried to obtain a B-stage resin composition layer B having a resin composition thickness of 30 µm and a gelatin time of 65 seconds. This B-stage resin composition layer B was disposed on one surface of a wholly aromatic polyamide (aramid) film having a thickness of 4.5 µm, the above release-film-attached B-stage resin composition sheet A was disposed on the other surface of the polyamide film while peeling off the protective film of the B-stage resin composition sheet, and these materials were continuously laminated with a heating roll at a temperature of 100° C. under a linear load of 5 kgf/cm and then rolled up, whereby heat-resistant film base-material-inserted double-side-release-film-attached B-stage resin composition sheets were produced (FIG. 3 (2)). The insulating layer thickness thereof was approximately 49 µm.

Separately, circuits were formed on an epoxy type copper-clad laminate having a thickness of 0.2 mm and having 12 µm thick copper foils on both surfaces (tradename: CCL-EL170, supplied by Mitsubishi Gas Chemical Company, INC.) and then the conductor circuits were treated by black copper oxide treatment. The above heat-resistant film base-material-inserted release-film-attached B-stage resin composition sheets were disposed on both surfaces of the copper-clad laminate after peeling off the release PET films. The resultant set was placed in a press machine. Temperature was increased from room temperature to 170° C. over 25 minutes and the pressure was set at 15 kgf/cm² from the beginning. The above set was maintained at a vacuum degree of 0.5 Torr at 170° C. for 30 minutes, to carry out curing treatment. Then, it was allowed to cool and then taken out to obtain a multilayer board having four layers. The release films on the external surfaces were removed (FIG. 4 (1)). Then, each surface was 1 shot irradiated with a carbon dioxide gas laser at an output of 12 mJ to form blind via holes having a diameter of 100 µm each.

Figure 4:
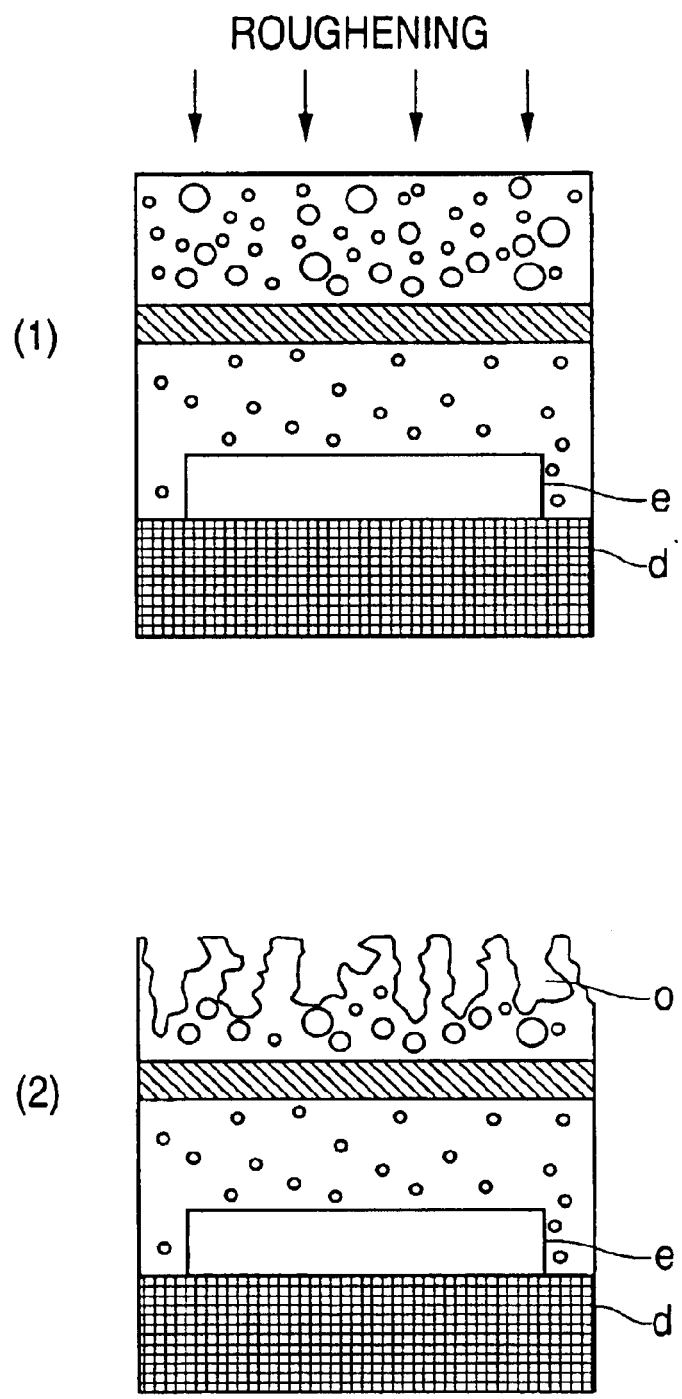
FIG. 4 is an explanatory drawing showing steps of producing a printed wiring board in Example 6.

Roughening treatment was carried out with a chromic acid aqueous solution, to attain a total roughness, from the resin surface, of 4.7~10.1 µm (average roughness Rz: 8.3 µm) (FIG. 4 (2)). In this case, a top of a concave portion did not reach the heat-resistant film. At the same time, a remaining resin layer in the bottom of each blind via hole was dissolved and removed. The insulating layer thickness after the molding was almost 30 µm.

Then, an electroless copper plating layer having a thickness of 0.5 µm was attached to each of the above roughened surfaces and an electrolytic copper plating layer having a thickness of 25 µm was further attached thereto. The board was placed in a heating furnace and temperature was gradually increased from 100° C. to 150° C. over 30 minutes. The temperature was further increased and the board was post-cured under heat at 170° C. for 60 minutes. The resultant board was used to form a copper conductor circuit by a semi-additive process and the surface of the conductor circuit was treated by black copper oxide treatment. Similar procedures were carried out to produce a multilayer printed wiring board having six layers. Table 3 shows results of evaluation of this printed wiring board.

Comparative Examples 9–10

In Examples 5 and 6, the same varnish C as that obtained in Example 5 and the varnish D as that obtained in Example 6 were respectively used to form a B-stage resin layer having a thickness, from tops of convex portions, of 40 µm on a release film, Example 5, and a B-stage resin layer having a thickness of 50 μm on a release film, Example 6, and release film-attached B-stage resin composition sheets were respectively obtained. Only these release film-attached B-stage resin composition sheets were used without the heat-resistant film base materials used in Example 5 and 6. Similar laminate-molding curing-treatment was carried out and roughening treatment was similarly carried out, to attain a total roughness, from the external layer, of 5~11 μm (average roughness Rz: 8~9 μm) similarly to Examples 5 and 6 (FIG. 5 (1) (2)), Comparative Example 10), and multilayer printed wiring boards having six layers were respectively similarly produced. Table 3 shows results of evaluation of these printed wiring boards.

Comparative Example 11

In Example 5, a glass woven cloth having a thickness of 20 μm was impregnated with the same varnish C as that obtained in Example 5, and the impregnated varnish was dried to obtain a prepreg having a total thickness (glass woven cloth+resin composition layer) of 40 μm and a gelation time (170°) of 84 seconds. The prepreg was disposed on each surface of an internal layer board. A release film having roughness was disposed thereon. Lamination-molding curing-treatment was similarly carried out to prepare a multilayer board having four layers. After separating the release films on the external layers, blind via holes were made. Roughening treatment was similarly carried out to attain a total roughness, from the external layer, of 5~11 μm (FIG. 6 (1)). After electroless copper plating and electrolytic copper plating, the formation of circuits and conductor black copper oxide treatment were similarly carried out. Then, prepregs were disposed, release films having roughness were disposed and lamination was similarly carried out. Then, the release films on the external surfaces were removed and blind via holes were formed. Desmear treatment, electroless copper plating and electrolytic copper plating were carried out. Then, circuits were formed to produce a multilayer printed wiring board having six layers.

In observation of a copper plating cross section, there were found many portions where concave portions due to the roughening reached the glass cloth (FIG. 6 (2)) and the copper plating was attached. Table 3 shows results of evaluation of this printed wiring board.

Comparative Example 12

A varnish was prepared in the same manner as in the preparation of the varnish D in Example 6 except that the carboxyl-group-modified acrylic multilayer structure powder, the finely-pulverized silica and the acrylonitrile-butadiene rubber were not used. The varnish was applied to a release film having flat surfaces and then the applied varnish was dried to prepare release-film-attached B-stage resin composition sheets having a resin layer having a thickness of 50 μm and a gelation time (170° C.) of 75 seconds. The release-film-attached B-stage resin composition sheet was disposed on each surface of an internal layer board and the resultant set was laminated at 100° C. under a linear load of 5 kgf/cm. Then, the release films were separated. Electrolytic copper foils having a thickness of 18 μm each (surface roughness 3.7~5.5 μm, average roughness Rz 4.5 μm) were disposed on the resultant resin surfaces, one copper foil on one surface. Laminate-molding-curing treatment was similarly carried out to prepare a multilayer board having four layers. After the release films on the external layers were removed, blind via holes were similarly made with a $CO_2$ laser. Roughening treatment was carried out under the same conditions as those in Example 6 (FIG. 7 (1) (2)). Electroless copper plating and electrolytic copper plating were carried out. Then, conductor circuits were formed and the conductor was subjected to black copper oxide treatment. The release-film-attached B-stage resin composition sheets were disposed and laminate-molding was carried out. Then, similar procedures were carried out to produce a six-layered printed wiring board. Table 3 shows results of evaluation of this printed wiring board.

TABLE 3

| Item | Examples | | Comparative Examples | | | |
|---|---|---|---|---|---|---|
| | 5 | 6 | 9 | 10 | 11 | 12 |
| Copper adhesive strength (kgf/cm) | | | | | | |
| | 1.22 | 1.31 | 1.21 | 1.39 | 1.08 | 0.47 |
| Soldering heat resistance | | | | | | |
| | No failure | No failure | No failure | Partial swelling | Partial swelling | Many swellings |
| Glass transition temperature DMA (° C.) | | | | | | |
| | 197 | 153 | 198 | 154 | 192 | 168 |
| Elastic modulus 25° C. (kgf/mm$^2$) | | | | | | |
| | 1,502 | 1,321 | 1,078 | 987 | 1,826 | 887 |
| Warp · distortion (mm) | | | | | | |
| | 1.2 | 1.6 | 4.3 | 5.4 | 1.6 | 5.3 |
| Thickness variance (μm) | | | | | | |
| | 4.6 | 5.7 | 9.9 | 12.8 | 7.8 | 12.9 |
| Blind via hole · Heat cycle test Rate of change of resistance (%) | | | | | | |
| | 1.5 | 2.1 | 2.2 | 2.7 | 1.7 | >10 |
| Crack occurrence | | | | | | |
| 100 cycles | 0/1,000 | 0/1,000 | — | — | 0/1,000 | 150/1,000 |
| 300 cycles | 0/1,000 | 5/1,000 | — | — | 0/1,000 | 768/1,000 |
| 500 cycles | 0/1,000 | 201/1,000 | — | — | 87/1,000 | 993/1,000 |

TABLE 3-continued

| | Examples | | Comparative Examples | | | |
|---|---|---|---|---|---|---|
| Item | 5 | 6 | 9 | 10 | 11 | 12 |
| Migration resistance (Ω) | | | | | | |
| Ordinary state | $6 \times 10^{13}$ | $4 \times 10^{13}$ | $5 \times 10^{13}$ | $5 \times 10^{13}$ | $4 \times 10^{13}$ | $5 \times 10^{13}$ |
| 200 hours | $6 \times 10^{11}$ | $6 \times 10^{10}$ | $2 \times 10^{10}$ | $5 \times 10^{8}$ | $3 \times 10^{9}$ | $3 \times 10^{8}$ |
| 500 hours | $1 \times 10^{11}$ | $2 \times 10^{10}$ | $8 \times 10^{9}$ | $<10^{8}$ | $<10^{8}$ | $<10^{8}$ |

<Measurement Methods>

1) Glass transition temperature: Each varnish was applied to a copper foil and the applied varnish was dried. These procedures were repeated to attain a thickness of 0.8 mm. Then, a copper foil was disposed on the resin composition surface and the resin composition layer was cured under each lamination curing condition. Then, the copper foils on the external surfaces were etched and measurement was carried out by DMA method. In Comparative Example 3, twenty prepregs were used and laminate-molded to attain a thickness of almost 0.8 mm.

2) Rate of change of resistance and cracks in blind via hole·heat cycle test: 1,000 blind via holes (diameter 100 μm, land 180 μm) formed between the second layer and the third layer of each six-layered printed wiring board were connected to one another alternately on the second layer and the third layer. One cycle consisted of −65° C./30 minutes⇄+150° C./30 minutes and 200 cycles were repeated. The maximum value of changes of resistance values was measured. Further, hole cross sections were observed at 100 cycles, 300 cycles and 500 cycles to check the occurrence of resin cracks. Numerator shows the number of occurrence and denominator shows the number of tested pieces.

Example 7

400 Parts of 2,2-bis(4-cyanatophenyl)propane monomer was melted at 150° C. and allowed to react for 4 hours with stirring, to prepare a prepolymer having an average molecular weight of 1,900. The prepolymer was dissolved in methyl ethyl ketone, to prepare a varnish. To the varnish were added 100 parts of a bisphenol A type epoxy resin (trade name: Epikote 828, supplied by Japan epoxy resin), 150 parts of a bisphenol F type epoxy resin (trade name: EXA830LVP, supplied by Dainippon Ink And Chemicals, Incorporated) and 100 parts of a novolak type epoxy resin (trade name: DEN438, supplied by Dow Chemical) as epoxy resins liquid at room temperature, and 150 parts of a bisphenol A type epoxy resin (trade name: Epikote 1001, supplied by Japan epoxy resin) and 100 parts of a cresol novolak type epoxy resin (trade name: ESCN220F, supplied by Sumitomo Chemical Co., Ltd.) as epoxy resins solid at room temperature. As a heat-curing catalyst, 0.3 part of iron acetylacetonate dissolved in methyl ethyl ketone was added to the mixture. 100 parts of a liquid epoxidized polybutadiene resin (trade name: E-1000-8.0, supplied by NIPPON PETROCHEMICALS CO., LTD) and 30 parts of an epoxy-group-modified acrylic multilayer structure powder (trade name: Staphyloid IM-203, average particle diameter 0.2 μm, maximum particle diameter 0.5 μm) were added to the resultant mixture, and these materials were homogeneously stirred and mixed, to prepare a varnish.

The above varnish was continuously applied to a mat surface of a 18 μm thick copper foil (roughness 3.5~6.2 μm, average roughness Rz: 4.6 μm), and the applied varnish was dried to obtain a B-stage resin composition layer having a thickness, from top of the maximum convex portion of the copper foil, of 5.7 μm and a gelatin time of 48 seconds at 170° C. At the time when the resultant copper foil came out from a drying zone, a 20 μm thick protective polypropylene film was placed on the resin layer surface. These materials were laminated at 100° C. under a linear load of 4 kgf/cm, to prepare a copper-foil-attached B-stage resin composition sheet.

Further, 700 parts of a bisphenol A type epoxy resin (trade name: Epikote 1001, supplied by Japan epoxy resin), 140 parts of a bisphenol F type epoxy resin (trade name: EXA830LVP, supplied by Dainippon Ink And Chemicals, Incorporated) and 160 parts of a cresol novolak type epoxy resin (trade name: ESCN220F, supplied by Sumitomo Chemical Co., Ltd.) were added to 1,000 parts, solid content, of the above varnish obtained from the prepolymer of the propane monomer. As a heat-curing catalyst, 0.5 part of iron acetylacetonate dissolved in methyl ethyl ketone was added to the mixture. 150 parts of a liquid epoxidized polybutadiene resin (trade name: E-1800-8.0, supplied by NIPPON PETROCHEMICALS CO., LTD), 80 parts of an epoxy-group-modified acrylic multilayer structure powder (trade name: Staphyloid IM-203, average particle diameter 0.2 μm, maximum particle diameter 0.5 μm) and 400 parts of talc (average particle diameter 1.8 μm, maximum particle diameter 4.2 μm) were added to the resultant mixture, and these materials were homogeneously stirred and mixed, to prepare a varnish A.

Figure 8:
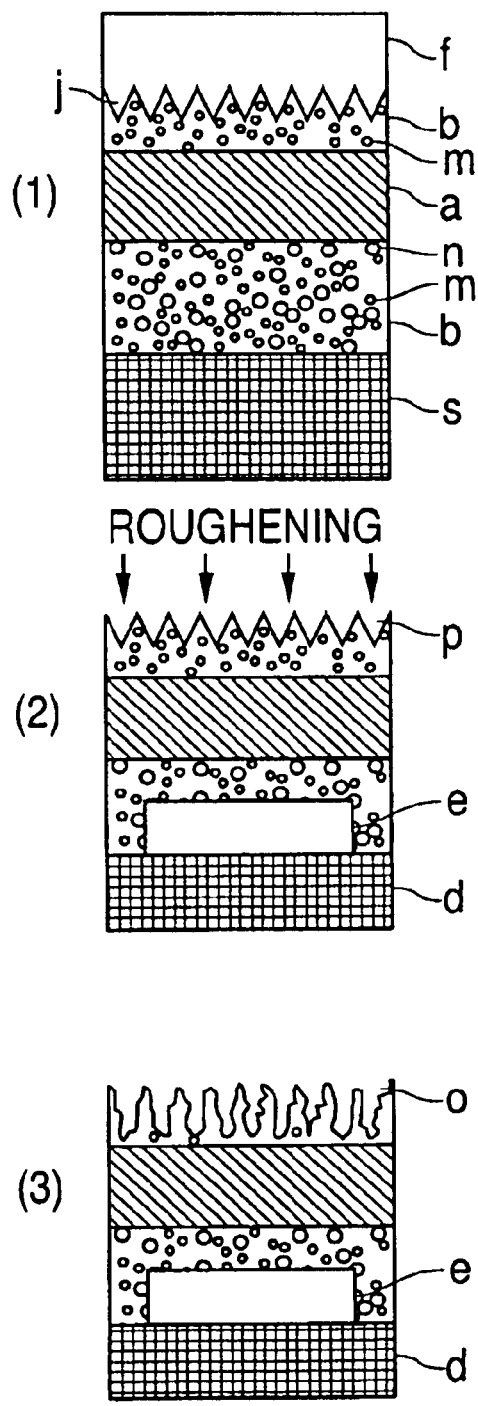
FIG. 8 is an explanatory drawing showing steps of producing a printed wiring board in Example 7.

This varnish A was continuously applied to one surface of a 25 μm thick release PET film having smooth surfaces and the applied varnish was dried to obtain a B-stage resin layer having a gelatin time of 55 seconds and a thickness of 25 μm. At the time when the resultant film came out from a drying zone, a 20 μm thick polypropylene protective film was placed on the resin layer surface. These materials were laminated at 100° C. under a linear load of 4 kgf/cm, to prepare a release film-attached B-stage resin composition sheet. A 10 μm thick polyimide film was prepared and both surfaces thereof were treated by plasma treatment. The release film-attached B-stage resin composition sheet was disposed on one surface of the polyimide film while separating the protective film, and the above copper-foil-attached B-stage resin composition sheet was disposed on the other surface of the polyimide film while separating the protective film. These materials were continuously laminated at 100° C. under a linear load of 5 kgf/cm to integrate them, whereby heat-resistant film base-material-inserted copper-foil-attached B-stage resin composition sheets were prepared (FIG. 8 (1)). The insulating layer thickness thereof from tops of convex portions of the copper foil was about 41 μm.

Separately, circuits were formed on a BT resin copper-clad laminate having an insulating layer thickness of 0.2 mm and having 12 μm thick copper foils on both surfaces (trade name: CCL-HL830, supplied by Mitsubishi Gas Chemical Company, INC.) and then the copper foils were treated by black copper oxide treatment, to prepare an internal layer board. The above heat-resistant film base-material-inserted copper-foil-attached B-stage resin composition sheets were placed on both surfaces of the internal layer board, one sheet on one surface, such that the resin layer of each B-stage resin composition sheet faced to the internal layer board. The resultant set was placed in a press machine. Temperature was increased from room temperature to 170° C. over 25 minutes and the pressure was set at 15 kgf/cm² from the beginning. The above set was maintained at a vacuum degree of 0.5 Torr at 170° C. for 30 minutes. Then it was allowed to cool and then taken out to obtain a multilayer board having four layers. The copper foils on the external surfaces were etched and removed. Then, each surface was 1 shot irradiated directly with a carbon dioxide gas laser at an output of 15 mJ to make blind via holes having a diameter of 100 μm each. The multilayer board was swollen with a potassium permanganate type desmear solution (supplied by Nippon MacDermid Co., Inc.), desmear (dissolution) was carried out and neutralization was carried out, to attain concave portions of 3.4~5.1 μm from the resin surface (average roughness Rz: 4.2 μm) and a total roughness, from the external layer, of 6.9~11.0 μm (average roughness Rz: 8.6 μm) (FIG. 8 (2) (3)). At the same time, a remaining resin layer in the bottom of each blind via hole was dissolved and removed. Then, an electroless copper plating layer having a thickness of 0.7 μm was attached to each of the above roughened surfaces and an electrolytic copper plating layer having a thickness of 25 μm was further attached thereto. The board was placed in a heating furnace and temperature was gradually increased from 100° C. to 150° C. over 30 minutes. Further, it was gradually increased up and the board was cured under heat at 200° C. for 60 minutes. The thickness of the insulating layer was measured in a cross section and it was almost 30 μm. The resultant board was used to form a copper conductor circuit by a semi-additive process and the surface of the conductor circuit was treated by black copper oxide treatment. The above procedures were repeated to produce a multilayer printed wiring board having six layers. Table 4 shows measurement results of properties of this printed wiring board.

Example 8

500 parts of a bisphenol A type epoxy resin (trade name: Epikote 1001, supplied by Japan epoxy resin), 500 parts of a phenol novolak type epoxy resin (trade name: DEN438, supplied by Dow Chemical), 30 parts of an imidazole type curing agent (trade name: 2E4MZ, supplied by Shikoku Corporation), 50 parts of a carboxyl-group-modified acrylic multilayer structure powder (trade name: Staphyloid IM-301, average particle diameter 0.2 μm, maximum particle diameter 0.9 μm), 40 parts of a finely-pulverized silica (average particle diameter 2.4 μm, maximum particle diameter 5.0 μm) and 30 parts of acrylonitrile-butadiene rubber (trade name: Nipol 1031, supplied by ZEON Corporation) were dissolved in methyl ethyl ketone, to obtain a solution. The solution was homogeneously dispersed with a three-roll mill to prepare a varnish. The varnish was continuously applied to one surface of a 20 μm thick aluminum foil (trade name: 20CF1, supplied by JAPAN CAPACITOR INDUSTRIAL CO., LTD.) having a surface roughness of 1.3~5.5 μm (average roughness Rz: 4.0 μm), and the applied varnish was dried to prepare an aluminum-foil-attached B-stage resin composition sheet having a resin composition layer having a thickness, from top of the maximum convex portion, of 6.0 μm (gelation time at 170° C., 51 seconds). At the time when it came out from a drying zone, a 25 μm thick protective polypropylene film was placed on the resin layer surface. These materials were continuously laminated with a roll at 100° C. under a linear load of 5 kgf/cm and then rolled up.

Further, 500 parts of a bisphenol A type epoxy resin (trade name: Epikote 1001, supplied by Japan epoxy resin), 450 parts of a phenol novolak type epoxy resin (trade name: DEN438, supplied by Dow Chemical), 30 parts of an imidazole type curing agent (trade name: 2E4MZ, supplied by Shikoku Corporation), 50 parts of a carboxyl-group-modified acrylic multilayer structure epoxy resin powder (trade name: Staphyloid IM-301, average particle diameter 0.2 μm) were added, further 300 parts of a talc (average particle diameter 4.2 μm) was added, and these materials were homogeneously dispersed with a three-roll mill, to prepare a varnish B. The varnish was continuously applied to a 25 μm thick release PET film and the applied varnish was dried to obtain a B-stage resin composition layer having a resin composition thickness of 19 μm and a gelatin time of 60 seconds. The B-stage resin composition layer was continuously disposed on one surface of a liquid crystal polyester film having a thickness of 25 μm, the above aluminum-foil-attached B-stage resin composition sheet was disposed on the other surface of the liquid crystal polyester film while separating the protective film of the B-stage resin composition sheet, and these materials were continuously laminated with a heating roll at a temperature of 100° C. under a linear load of 5 kgf/cm and then rolled up, whereby heat-resistant film base-material-inserted aluminum-foil-attached B-stage resin composition sheets were produced. The insulating layer thickness thereof from tops of convex portions of the metal foil was approximately 50 μm.

Separately, circuits were formed on an epoxy type copper-clad laminate having a thickness of 0.2 mm and having 12 μm thick copper foils on both surfaces (tradename: CCL-EL170, supplied by Mitsubishi Gas Chemical Company, INC.) and then the conductor circuits were treated by black copper oxide treatment. The above heat-resistant film base-material-inserted aluminum-foil-attached B-stage resin composition sheets were placed on both surfaces of the copper-clad laminate, one sheet on one surface, after separating the release PET films. The resultant set was placed in a press machine. The temperature was increased up to 170° C. over 25 minutes and the pressure was set at 15 kgf/cm² from the beginning. The above set was maintained at a vacuum degree of 0.5 Torr at 170° C. for 30 minutes, to carry out curing treatment. Then, it was allowed to cool and then taken out to obtain a multilayer board having four layers. The aluminum foils on the external surfaces were dissolved and removed with 10% hydrochloric acid solution. Then, each surface was 1 shot irradiated with a carbon dioxide gas laser at an output of 12 mJ to make blind via holes having a diameter of 100 μm each.

Roughening treatment was carried out with a chromic acid aqueous solution, to form concave portions of 3.6~5.0 μm from the resin surface (average roughness Rz: 4.1 μm) and attain a total roughness, from the external layer, of 4.7~10.0 μm (average roughness Rz: 8.0 μm). In this case, a top of a concave portion did not reach the heat-resistant film. At the same time, a remaining resin layer in the bottom of each blind via hole was dissolved and removed. The insulating layer thickness after the molding was almost 40 μm.

Then, an electroless copper plating layer having a thickness of 0.5 μm was attached to each of the above roughened surfaces and an electrolytic copper plating layer having a thickness of 25 μm was further attached thereto. The board was placed in a heating furnace and temperature was gradually increased from 100° C. to 150° C. over 30 minutes. Further, it was gradually increased and the board was cured under heat at 170° C. for 60 minutes. The resultant board was used to form a conductor circuit by a semi-additive process and the conductor circuit was treated by black copper oxide treatment. Similar procedures were carried out to produce a multilayer printed wiring board having six layers. Table 4 shows measurement results of properties of this printed wiring board.

Comparative Example 13–14

Figure 9:
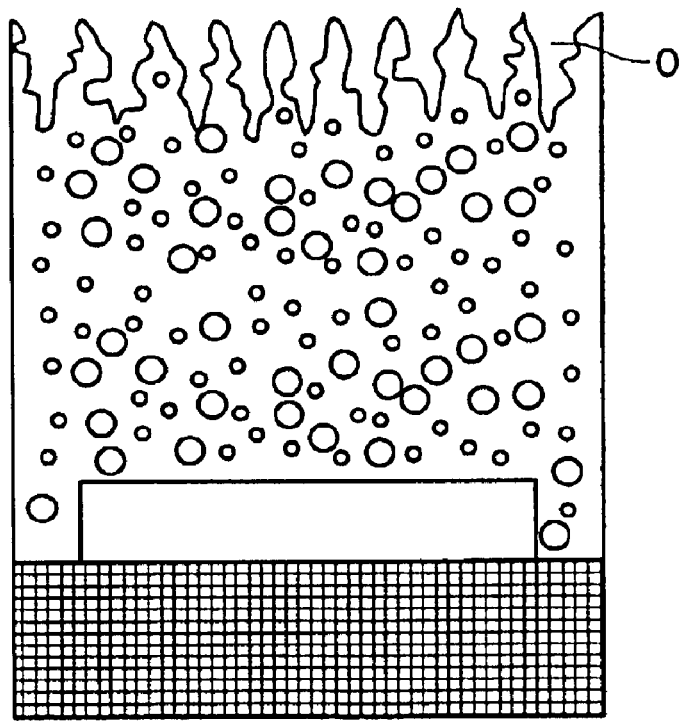
FIG. 9 is an explanatory drawing showing a roughened resin surface in Comparative Example 13.

In Examples 7 and 8, the same varnish A as that obtained in Example 7 and the varnish B as that obtained in Example 6 were respectively used to form a B-stage resin layer having a thickness, from tops of convex portions, of 40 μm on rough portions of a copper foil and a B-stage resin layer having a thickness, from tops of convex portions, of 50 μm on rough portions of a metal foil and to prepare metal-foil-attached B-stage resin composition sheets respectively. Only these metal-foil-attached B-stage resin composition sheets were used without the heat-resistant films used in Example 7 and 8. Similar laminate-molding curing treatment was carried out, roughening treatment was similarly carried out, to attain a total roughness, from the external layer, of 5~11 μm (average roughness Rz: 8~9 μm) similarly to Examples 7 and 8 (FIG. 9 (1), Comparative Example 13), and multilayer printed wiring boards having six layers were respectively similarly produced. Table 4 shows results of evaluation of these printed wiring boards.

Comparative Example 15

Figure 10:
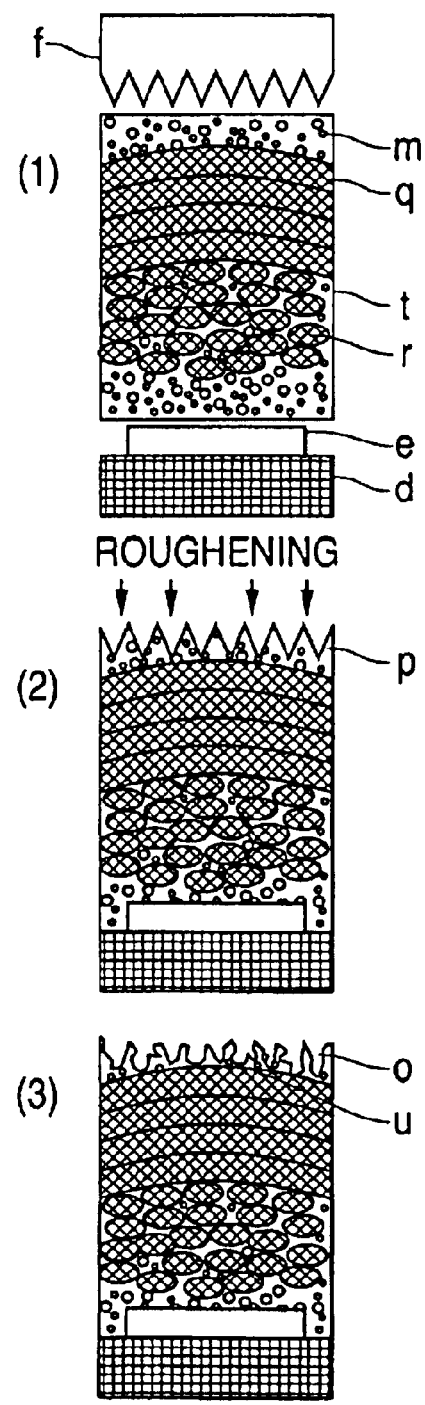
FIG. 10 is an explanatory drawing showing steps of producing a printed wiring board in Comparative Example 15.

In Example 7, a glass woven cloth having a thickness of 20 μm was impregnated with the same varnish A as that obtained Example 7 and the impregnated varnish was dried to obtain a prepreg having a total thickness (glass woven cloth+resin composition layer) of 40 μm and a gelation time (170°) of 54 seconds. The prepreg was disposed on each surface of an internal layer board. A copper foil having a thickness of 18 μm was disposed thereon. Lamination-molding-curing-treatment was similarly carried out to prepare a multilayer board having four layers (FIG. 10 (1)). After removing the copper foils on the external layers by etching, blind via holes were made. Roughening treatment was similarly carried out to attain a total roughness, from the external layer, of 5~11 μm (FIG. 10 (2)). After electroless copper plating and electrolytic copper plating, the formation of circuits and conductor black copper oxide treatment were similarly carried out. Then, prepregs were disposed, electrolytic copper foils having a thickness of 18 μm each were disposed, and lamination was similarly carried out. Then, the copper foils on the external surfaces were removed, blind via holes were formed. Desmear treatment, electroless copper plating and electrolytic copper plating were carried out. Then, circuits were formed to produce a multilayer printed wiring board having six layers. In observation of a copper plating cross section, there were found many portions where concave portions due to the roughening reached the glass cloth (FIG. 10 (3)) and the copper plating was attached. Table 4 shows results of evaluation of this printed wiring board.

Comparative Example 16

A varnish was prepared in the same manner as in Example 8 except that the epoxy resin powder, the carboxyl-group-modified acrylic multilayer structure powder, the finely-pulverized silica and the acrylonitrile-butadiene rubber were not used. The varnish was similarly applied to an aluminum foil surface having roughness and then the applied varnish was dried, to prepare aluminum-foil-attached B-stage resin composition sheets having a resin layer having a thickness, from tops of convex portions, of 50 μm and a gelation time (170° C.) of 77 seconds. The aluminum-foil-attached B-stage resin composition sheet was disposed on each surface of an internal layer board and the resultant set was similarly subjected to laminate-molding-curing-treatment, to prepare a multilayer board having four layers. Then, the aluminum foils on the external layers were dissolved and removed with 10% hydrochloric acid. Then, blind via holes were similarly made with a $CO_2$ laser. Roughening treatment was carried out under the same conditions as those in Example 8. Electroless copper plating and electrolytic copper plating were carried out. Then, conductor circuits were formed and the conductor was subjected to black copper oxide treatment. The aluminum-foil-attached B-stage resin composition sheets were disposed and laminate-molding was carried out. Then, similar procedures were carried out to produce a six-layered printed wiring board. Table 4 shows results of evaluation of this printed wiring board.

TABLE 4

|  | Examples | | Comparative Examples | | | |
| --- | --- | --- | --- | --- | --- | --- |
| Item | 7 | 8 | 13 | 14 | 15 | 16 |
| Copper adhesive strength (kgf/cm) | | | | | | |
|  | 1.25 | 1.37 | 1.24 | 1.37 | 1.16 | 0.46 |
| Soldering heat resistance | | | | | | |
|  | No failure | No failure | No failure | Partial swelling | Partial swelling | Partial swelling |
| Glass transition temperature DMA (° C.) | | | | | | |
|  | 201 | 153 | 201 | 153 | 202 | 168 |
| Elastic modulus 25° C. (kgf/mm$^2$) | | | | | | |
|  | 1,505 | 1,389 | 1,087 | 995 | 1,829 | 776 |
| Warp · distortion (mm) | | | | | | |
|  | 1.2 | 1.5 | 4.0 | 5.1 | 1.6 | 5.3 |
| Thickness variance (μm) | | | | | | |
|  | 4.5 | 6.1 | 9.8 | 12.6 | 7.8 | 12.9 |

TABLE 4-continued

| | Examples | | Comparative Examples | | | |
|---|---|---|---|---|---|---|
| Item | 7 | 8 | 13 | 14 | 15 | 16 |
| Blind via hole · Heat cycle test Rate of change of resistance (%) | 1.6 | 2.0 | 2.0 | 2.8 | 1.8 | >10 |
| Crack occurrence | | | | | | |
| 200 cycles | 0/1,000 | 0/1,000 | 0/1,000 | 0/1,000 | 0/1,000 | 210/1,000 |
| 400 cycles | 0/1,000 | 51/1,000 | 0/1,000 | 70/1,000 | 66/1,000 | 970/1,000 |
| Migration resistance ($\Omega$) | | | | | | |
| Ordinary state | $6 \times 10^{13}$ | $4 \times 10^{13}$ | $5 \times 10^{13}$ | $6 \times 10^{13}$ | $4 \times 10^{13}$ | $5 \times 10^{13}$ |
| 200 hours | $6 \times 10^{11}$ | $6 \times 10^{10}$ | $4 \times 10^{10}$ | $5 \times 10^{8}$ | $5 \times 10^{9}$ | $2 \times 10^{8}$ |
| 500 hours | $3 \times 10^{11}$ | $5 \times 10^{10}$ | $2 \times 10^{9}$ | $<10^{8}$ | $<10^{8}$ | $<10^{8}$ |

<Measurement Method>

1) Grass transition temperature: In Comparative Example 15, fourteen prepregs were used and laminate-molded to attain a thickness of almost 0.8 mm. Except for the above, measurement was carried out similarly to the other Examples.

Example 9

400 Parts of 2,2-bis(4-cyanatophenyl)propane monomer was melted at 150° C. and allowed to react for 4 hours with stirring, to prepare a mixture of monomer and prepolymer having an average molecular weight of 1,900. The mixture was dissolved in methyl ethyl ketone, to prepare a varnish. To the varnish were added 50 parts of a bisphenol A type epoxy resin (trade name: Epikote 828, supplied by Japan epoxy resin), 50 parts of a bisphenol F type epoxy resin (trade name: EXA830LVP, supplied by Dainippon Ink And Chemicals, Incorporated) and 50 parts of a novolak type epoxy resin (trade name: DEN438, supplied by Dow Chemical) as epoxy resins liquid at room temperature, and 300 parts of a bisphenol A type epoxy resin (trade name: Epikote 1001, supplied by Japan epoxy resin) and 100 parts of a cresol novolak type epoxy resin (trade name: ESCN220F, supplied by Sumitomo Chemical Co., Ltd.) as epoxy resins solid at room temperature. As a heat-curing catalyst, 0.3 part of iron acetylacetonate dissolved in methyl ethyl ketone was added to the mixture. 100 parts of a liquid epoxidized polybutadiene resin (trade name: E-1000-8.0, supplied by NIPPON PETROCHEMICALS CO., LTD) and 100 parts of an epoxy-group-modified acrylic multilayer structure organic powder (trade name: Staphyloid IM-203, average particle diameter 0.2 μm, maximum particle diameter 0.5 μm) were added to the resultant mixture, and these materials were homogeneously stirred and mixed, to prepare a varnish A.

The above varnish A was continuously applied to a 18 μm thick aluminum foil (roughness 6.0~10.9 μm, average roughness Rz: 8.9 μm) and the applied varnish was dried to obtain a B-stage resin composition layer having a height, from top of the maximum convex portion, of 5.9 μm and a gelatin time of 53 seconds at 170° C. At the time when the resultant aluminum foil came out from a drying zone, a 15 μm thick protective polypropylene film was placed on the resin layer surface. These materials were laminated at 100° C. under a linear load of 4 kgf/cm, to prepare an aluminum-foil-attached B-stage resin composition sheet.

Further, 700 parts of a bisphenol A type epoxy resin (trade name: Epikote 1001, supplied by Japan epoxy resin), 140 parts of a bisphenol F type epoxy resin (trade name: EXA830LVP, supplied by Dainippon Ink And Chemicals, Incorporated) and 160 parts of a cresol novolak type epoxy resin (trade name: ESCN220F, supplied by Sumitomo Chemical Co., Ltd.) were added to 1,000 parts, solid content, of the above varnish obtained from the prepolymer of the propane monomer. As a heat-curing catalyst, 0.5 part of iron acetylacetonate dissolved in methyl ethyl ketone was added to the mixture. 300 parts of calcined talc (average particle diameter 2.5 μm) was added to the resultant mixture, and these materials were homogeneously stirred and mixed, to prepare a varnish.

This varnish was continuously applied to one surface of a 25 μm thick release PET film having smooth surfaces and the applied varnish was dried to obtain a B-stage resin layer having a gelatin time of 59 seconds and a thickness of 22 μm. At the time when the resultant film came out from a drying zone, the resin surface of this film was bought into contact with one surface of a 12.5 μm thick polyimide film having both surfaces treated by plasma treatment and the above aluminum-foil-attached B-stage resin composition sheet was disposed on the other surface of the polyimide film. These materials were continuously laminated at 100° C. under a linear load of 5 kgf/cm to integrate them, whereby heat-resistant film base-material-reinforcing aluminum-foil-attached B-stage resin composition sheets were prepared.

Figure 11:
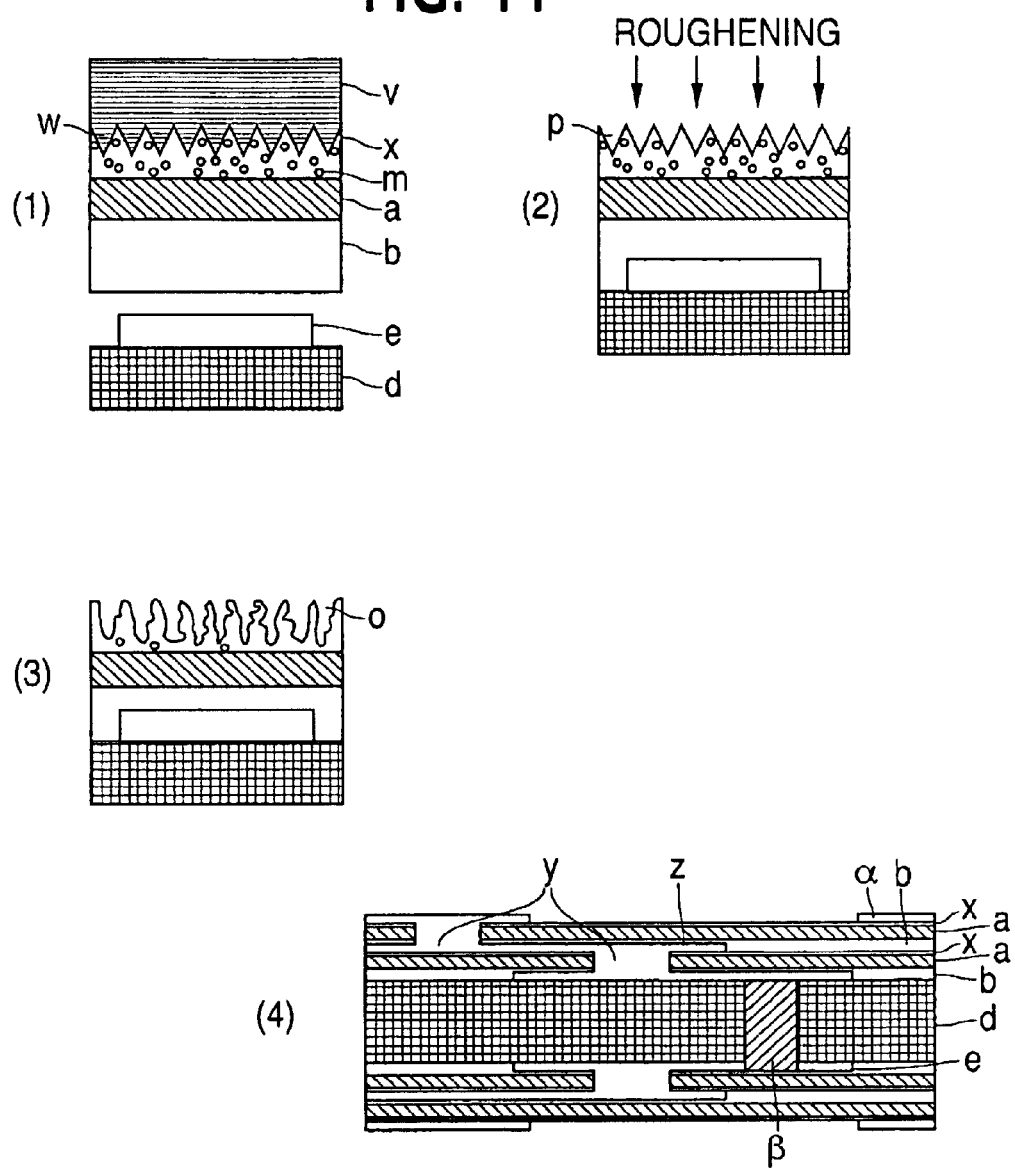
FIG. 11 is an explanatory drawing showing steps of producing a printed wiring board in Example 9.

Separately, circuits were formed on a BT resin copper-clad laminate having an insulating layer thickness of 0.2 mm and having 12 μm thick copper foils on both surfaces (trade name: CCL-HL830, supplied by Mitsubishi Gas Chemical Company, INC.) and then the copper foils were treated by black copper oxide treatment, to prepare an internal layer board. The above heat-resistant film base-material-reinforcing aluminum-foil-attached B-stage resin composition sheets were placed on both surfaces of the internal layer board, one sheet on one surface, after separating the releasing films such that the resin layer of each B-stage resin composition sheet faced to the internal layer board. The resultant set was placed in a press machine. It was temperature-increased from room temperature to 165° C. over 25 minutes and the pressure was set at 20 kgf/cm² from the beginning. The above set was maintained at a vacuum degree of 0.5 Torr at 165° C. for 30 minutes. Then it was allowed to cool and then it was taken out to obtain a multilayer board having four layers (FIG. 11 (1)). The aluminum foils on the external surfaces were dissolved and removed. Then, each surface was 1 shot irradiated with a carbon dioxide gas laser at an output of 12 mJ to form blind via holes having a diameter of 100 μm each. The multilayer board was swollen with a potassium permanganate type desmear solution (supplied by Nippon MacDermid Co., Inc.), desmear (dissolution) was carried out and neutralization was carried out, to attain a total roughness, from the external layer, of 7.8~12.5 μm (average roughness Rz: 9.9 μm) (FIG. 11 (2) (3)). At the same time, a remaining resin layer in the bottom of each blind via hole was dissolved and removed. Then, an electroless copper plating layer having a thickness of 0.5 μm was attached to each of the above roughened surfaces and an electrolytic copper plating layer having a thickness of 25 μm was further attached thereto. The board was placed in a heating furnace and temperature was gradually increased from 100° C. to 150° C. over 30 minutes. Further it was gradually increased up and the board was cured under heat at 200° C. for 60 minutes. The thickness of the insulating layer was measured in a cross section and it was almost 30 μm. The resultant board was used to form a copper conductor circuit by a semi-additive process and the surface of the conductor circuit was treated by black copper oxide treatment. The above procedures were repeated to produce a multilayer printed wiring board having six layers (FIG. 11 (4)). Table 5 shows results of evaluation of this printed wiring board.

Example 10

500 parts of a bisphenol A type epoxy resin (trade name: Epikote 1001, supplied by Japan epoxy resin), 450 parts of a phenol novolak type epoxy resin (trade name: DEN438, supplied by Dow Chemical), 30 parts of an imidazole type curing agent (trade name: 2E4MZ, supplied by Shikoku Corporation), 60 parts of a carboxyl-group-modified acrylic multilayer structure organic powder (trade name: Staphyloid IM-301, average particle diameter 0.2 μm), 40 parts of a finely-pulverized silica (average particle diameter 2.4 μm) and 30 parts of acrylonitrile-butadiene rubber (trade name: Nipol 1031, supplied by ZEON Corporation) were dissolved in methyl ethyl ketone, to obtain a solution. The solution was homogeneously dispersed with a three-roll mill to prepare a varnish B. The varnish was continuously applied to a surface of a 25 μm thick PET film and the applied varnish was dried to prepare release-film-attached B-stage resin composition sheets X having a resin layer having a thickness of 15.0 μm (gelation time at 170° C., 63 seconds).

Further, 500 parts of a bisphenol A type epoxy resin (trade name: Epikote 1001, supplied by Japan epoxy resin), 500 parts of a phenol novolak type epoxy resin (trade name: DEN438, supplied by Dow Chemical) and 30 parts of an imidazole type curing agent (trade name: 2E4MZ, supplied by Shikoku Corporation) were added and these materials were homogeneously dispersed with a three-roll mill, to prepare a varnish C. The varnish was continuously applied to a 25 μm thick release PET film having smooth surface and the applied varnish was dried to obtain a B-stage resin composition sheet Y having a resin composition thickness of 20 μm and a gelatin time of 65 seconds. The B-stage resin composition sheet Y was continuously disposed on one surface of a wholly polyamide (aramid) film having a thickness of 4.5 μm. These materials were continuously laminated with a heating roll at a temperature of 100° C. under a linear load of 5 kgf/cm and then rolled up, whereby heat-resistant film base-material-reinforcing release-film-attached B-stage resin composition sheets were produced.

Separately, circuits were formed on an epoxy type copper-clad laminate having a thickness of 0.2 mm and having 12 μm thick copper foils on both surfaces (trade name: CCL-EL170, supplied by Mitsubishi Gas Chemical Company, INC.) and then the conductor circuits were treated by black copper oxide treatment. After separating the release PET films of the B-stage resin composition sheets Y, the above heat-resistant film base-material-reinforcing release-film-attached B-stage resin composition sheets were placed on both surfaces of the copper-clad laminate, one on each surface. The release-film-attached B-stage resin composition sheets X were disposed thereon, one on each surface. The resultant set was placed in a press machine. It was temperature-increased from room temperature to 170° C. over 25 minutes and the pressure was set at 25 kgf/cm² from the beginning. The above set was maintained at a vacuum degree of 0.5 Torr at 170° C. for 30 minutes, to carry out curing treatment. Then, it was allowed to cool and then taken out to obtain a substrate. The release films on the external surfaces were removed. Then, each surface was 1 shot irradiated with a carbon dioxide gas laser at an output of 12 mJ to form blind via holes having a diameter of 100 μm each.

Roughening treatment was carried out with a chromic acid aqueous solution, to attain a total roughness, from the resin layer, of 4.8~10.3 μm (average roughness Rz: 8.4 μm). In this case, a top of a concave portion did not reach the heat-resistant film. At the same time, a remaining resin layer in the bottom of each blind via hole was dissolved and removed. The insulating layer thickness after the molding was almost 20 μm.

Then, an electroless copper plating layer having a thickness of 0.5 μm was attached to each of the above roughened surfaces and an electrolytic copper plating layer having a thickness of 25 μm was further attached thereto. The board was placed in a heating furnace and temperature was gradually increased from 100° C. to 150° C. over 30 minutes. Further, it was gradually increased and the board was post-cured under heat at 170° C. for 60 minutes. The resultant board was used to form a conductor circuit by a semi-additive process and the conductor circuit was treated by black copper oxide treatment. Similar procedures were carried out to produce a multilayer printed wiring board having six layers. Table 5 shows results of evaluation of this printed wiring board.

Comparative Example 17–18

In Examples 9 and 10, the same varnish A as that obtained in Example 9 and the varnish B as that obtained in Example 10 were used. The varnishes were applied to the same metal foil as that used in Example 9 and the same release film as that used in Example 10, respectively, to form a resin layer having a thickness, from tops of convex portions, of 40 μm, Example 9, and a resin layer having a thickness of 40 μm on the release film, Example 10, whereby a metal-foil-attached B-stage resin composition sheet and a release-film-attached B-stage resin composition sheet were prepared respectively. Only the metal-foil-attached B-stage resin composition sheet and the release-film-attached B-stage resin composition sheet were used without the heat-resistant film base-material-reinforcing B-stage resin composition sheets used in Example 9 and 10. Similar laminate-molding-curing-treatment was carried out and roughening treatment was similarly carried out, to attain a total roughness, from the external layer, of 7~13 μm (average roughness Rz: 8~11 μm) similarly to Examples 9 and 10, and multilayer printed wiring boards having six layers were similarly produced respectively. Table 5 shows results of evaluation of these printed wiring boards.

Comparative Example 19

Figure 12:
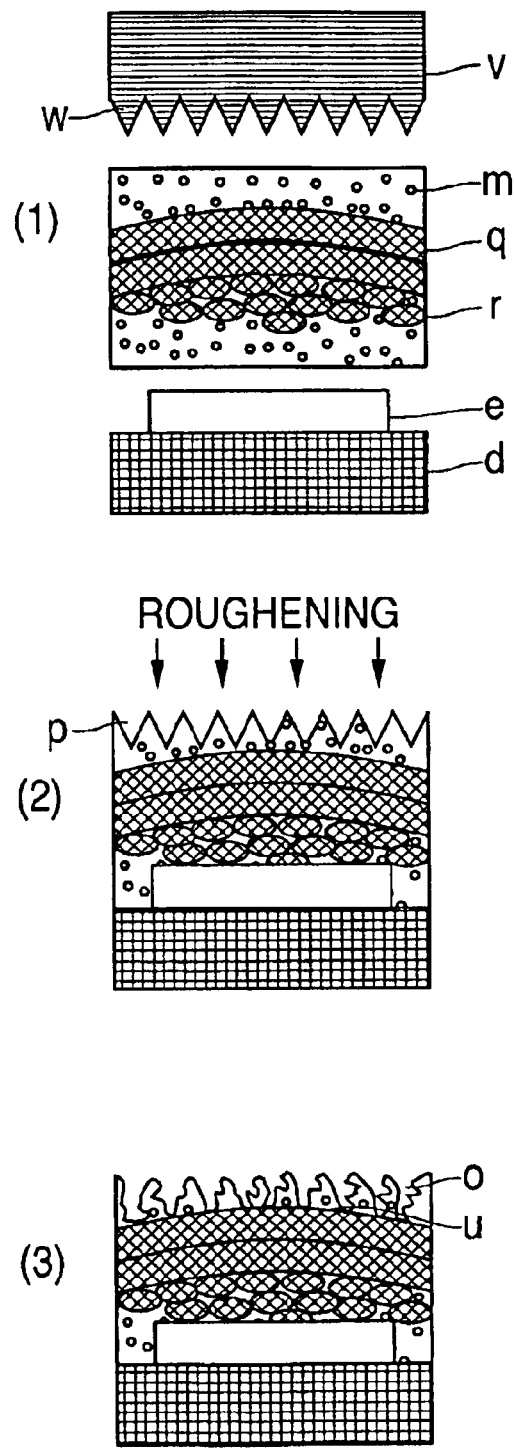
FIG. 12 is an explanatory drawing showing steps of producing a printed wiring board in Comparative Example 19.

In Example 9, a glass woven cloth having a thickness of 20 μm was impregnated with the same varnish A as that obtained in Example 9 and the impregnated varnish was dried to obtain a prepreg having a total thickness (glass woven, cloth+resin composition layer) of 40 μm and a gelation time (170°) of 84 seconds. The prepreg was disposed on each surface of an internal layer board. Aluminum foils having the same roughness were disposed on both surface of the resultant board (FIG. 12 (1)). Lamination-molding-curing-treatment was similarly carried out to prepare a multilayer board having four layers. After dissolving and removing the aluminum foils on the external layers, blind via holes were made. Roughening treatment was similarly carried out to attain a total roughness, from the external layer, of 5~11 μm (FIG. 12 (2)). After electroless copper plating and electrolytic copper plating, the formation of circuits and conductor black copper oxide treatment were similarly carried out. Then, prepregs were disposed, aluminum foils having roughness were disposed, and lamination was similarly carried out. Then, the aluminum foils on the external surfaces were removed, blind via holes were formed. Desmear treatment, electroless copper plating and electrolytic copper plating were carried out. Then, circuits were formed to produce a multilayer printed wiring board having six layers. In observation of a copper plating cross section, there were found many portions where concave portions due to the roughening reached the glass cloth (FIG. 12 (3)) and the copper plating was attached. Table 5 shows results of evaluation of this printed wiring board.

Comparative Example 20

The same varnish C as that prepared in Example 10 was used. 100 parts of a finely-pulverized silica was added to the above varnish, to prepare a varnish. This varnish was applied to the aluminum foil as that used in Example 9 and then the applied varnish was dried to prepare an aluminum-foil-attached B-stage resin composition sheet having a resin layer having a thickness, from tops of convex portions of the aluminum foil, of 40 μm and a gelation time of 67 seconds. The aluminum-foil-attached B-stage resin composition sheet was disposed on each surface of the same internal layer board as that used in Example 10 and the resultant set was subjected to curing-treatment lamination similarly to Example 10. Then, the aluminum foils were dissolved and removed. Then, roughening treatment was similarly carried out. Copper plating and circuit formation and black copper oxide treatment were repeated, to produce a six-layered printed wiring board. Table 5 shows results of evaluation of this printed wiring board.

Example 11

500 parts of a bisphenol A type epoxy resin (trade name: Epikote 1001, supplied by Japan epoxy resin), 450 parts of a phenol novolak type epoxy resin (trade name: DEN438, supplied by Dow Chemical), 30 parts of an imidazole type curing agent (trade name: 2E4MZ, supplied by Shikoku Corporation) and 400 parts of talc (average particle diameter 1.8 μm, maximum particle diameter 4.2 μm) were added. These materials were homogeneously dispersed with a three-roll mill, to prepare a varnish A. The varnish was continuously applied to a 25 μm thick release PET film having smooth surfaces, and the applied varnish was dried to prepare a B-stage resin composition layer having a resin composition thickness of 20 μm and a gelation time of 65 seconds. The B-stage resin composition layer was disposed on one surface of a wholly aromatic polyamide (aramid) film having a thickness of 4.5 μm and continuously laminated with a heating roll at a temperature of 100° C. under a linear load of 5 kgf/cm, whereby heat-resistant film base-material-reinforcing release-film-attached B-stage resin composition sheets were produced. Further, the varnish A was continuously applied to a mat surface of an electrolytic copper foil having a thickness of 12 μm and a shiny surface having a 1 μm thick nickel·cobalt alloy treatment, and the applied varnish was dried, whereby copper-foil-attached B-stage resin composition sheets having a B-stage resin composition layer having a thickness, from tops of convex portions, of 6.0 μm and a gelation time of 67 seconds were produced. At the time when the resultant copper foil came out from a drying zone, a 15 μm thick protective polypropylene film was disposed. These materials were bonded with a heating roll at 90° C. under a linear load of 5 kgf/cm, to integrate them.

Separately, circuits are formed in an epoxy type copper-clad laminate (trade name; CCL-EL170, supplied by Mitsubishi Gas Chemical Company, INC.) having a thickness of 0.2 mm and having 12 μm thick copper foils on both surfaces and conductors were subjected to black copper oxide treatment to prepare an internal layer board. The above heat-resistant film base-material-reinforcing release-film-attached B-stage resin composition sheet was disposed on each surface of the internal layer board after separating the release film on one surface of the B-stage resin composition sheet. These materials were bonded to each other with a heating roll at a temperature of 100° C. under a linear load of 5 kgf/cm. The copper-foil-attached B-stage resin composition sheets were disposed on both surfaces of the resultant board, one sheet on each surface, after separating the protective films. The resultant set was laminate-molded under a vacuum of 30 mmHg or less for 2 hours at 110° C.·30 minutes+180° C.·90 minutes and 5 kgf/cm²·15 minutes+20 kgf/cm²·125 minutes. The insulating layer thickness of external layer was almost 20 μm. Each surface of the multilayer board was 1 shot irradiated with a carbon dioxide gas laser at an output of 13 mJ to form blind via holes having a diameter of 100 μm. Copper foil burrs occurring in the blind via hole portions were dissolved with an etching solution and at the same time the copper foils were dissolved until the copper foils had a thickness of 4 μm each. After desmear treatment, electroless copper plating was attached to a thickness of 0.5 μm and electrolytic copper plating was attached to a thickness of 15 μm. At the same time, the inside of each blind via hole was filled with the plating. Then, circuits were formed by a general method and black copper oxide treatment was carried out. Then, similar procedures were repeated to produce a six-layered printed wiring board. Table 6 shows results of evaluation of this printed wiring board.

Comparative Example 21

The same varnish A obtained in Example 11 was used. A glass woven cloth having a thickness of 20 μm was impregnated with the varnish and the impregnated varnish was dried to prepare a prepreg having a gelation time of 67 seconds and a thickness of 40 μm. The prepreg was placed on each surface of an internal layer board. An electrolytic copper foil having a shiny surface having a 1 μm thick nickel·cobalt alloy treatment was disposed thereon and the resultant set was similarly laminate-molded to prepare a four-layered board. Holes were similarly made with a carbon dioxide gas laser and the resultant board was similarly processed to prepare a four-layered printed wiring board. Further, a six-layered printed wiring board was produced therefrom. Table 6 shows results of evaluation of this printed wiring board.

TABLE 5

| Item | Examples | | Comparative Examples | | | |
|---|---|---|---|---|---|---|
| | 9 | 10 | 17 | 18 | 19 | 20 |
| Copper adhesive strength (kgf/cm) | 1.24 | 1.34 | 1.23 | 1.34 | 1.15 | 0.53 |
| Soldering heat resistance | No failure | No failure | No failure | Partial swelling | Partial swelling | Many swellings |
| Glass transition temperature DMA (° C.) | 197 | 153 | 198 | 154 | 197 | 167 |
| Elastic modulus 25° C. (kgf/mm$^2$) | 1,502 | 1,321 | 1,078 | 987 | 1,826 | 990 |
| Warp · distortion (mm) | 1.1 | 1.7 | 4.4 | 5.4 | 1.6 | 5.0 |
| Thickness variance (μm) | 4.5 | 5.8 | 10.0 | 12.8 | 7.8 | 12.5 |
| Migration resistance (Z direction) (Ω) | | | | | | |
| Ordinary state | $5 \times 10^{13}$ | $5 \times 10^{13}$ | $5 \times 10^{13}$ | $5 \times 10^{13}$ | $4 \times 10^{13}$ | $5 \times 10^{13}$ |
| 200 hours | $6 \times 10^{11}$ | $6 \times 10^{10}$ | $2 \times 10^{10}$ | $5 \times 10^8$ | $3 \times 10^9$ | $9 \times 10^8$ |
| 600 hours | $1 \times 10^{11}$ | $2 \times 10^{10}$ | $2 \times 10^8$ | $<10^8$ | $<10^8$ | $<10^8$ |
| Migration resistance (X direction) (Ω) | | | | | | |
| Ordinary state | $6 \times 10^{13}$ | $5 \times 10^{13}$ | — | — | — | — |
| 200 hours | $4 \times 10^{11}$ | $3 \times 10^9$ | — | — | — | — |
| 500 hours | $5 \times 10^{10}$ | $<10^8$ | — | — | — | — |

TABLE 6

| Item | Example 11 | Comparative Example 21 |
|---|---|---|
| Glass transition temperature DMA (° C.) | 167 | 168 |
| Migration resistance (Z direction) (Ω) | | |
| Ordinary state | $5 \times 10^{13}$ | $5 \times 10^{13}$ |
| 100 Hours | $1 \times 10^{11}$ | $7 \times 10^8$ |
| 500 Hours | $8 \times 10^{10}$ | $<10^8$ |

<Measurement Methods>

1) Elastic modulus: In each Example and Comparative Example, all internal and external metal foils were removed, laminations on front and reverse surfaces were carried out two times, to prepare a six-layer structure and elastic modulus was measured by DMA method. Table 5 shows elastic modulus at 25° C. in a DMA chart.

What is claimed is:

1. A heat-resistant-film-inserted B-stage resin composition sheet for lamination, comprising a heat-resistant film and B-stage resin composition layers for lamination formed on both surfaces of the heat-resistant film, wherein:
   i. the thickness of the heat-resistant film is 4 to 20 μm,
   ii. the thickness of the B-stage resin composition layer on one surface of the heat-resistant film is 5 to 10 μm and the thickness of the B-stage resin composition layer on the other surface of the heat-resistant film is 10 to 100 μm,
   iii. the resin composition to be attached to at least one surface of the heat-resistant film, contains, as an essential component, a resin component containing (a) a polyfunctional cyanate ester monomer and/or a polyfunctional cyanate ester prepolymer in an amount of 100 parts by weight, (b) an epoxy resin which is liquid at room temperature in an amount of 15 to 500 parts by weight and (c) a heat-curing catalyst in a ratio of 0.005 to 10 parts by weight per 100 parts by weight of (a)+(b), and
   iv. the heat-resistant film is one member selected from the group consisting of a polyimide film, a liquid crystal polyester film and a wholly aromatic polyamide film.

2. The heat-resistant-film-inserted B-stage resin composition sheet according to claim 1,
   wherein a metal foil is attached to one surface of the sheet and the metal foil has convex and concave portions on at least one surface of the metal foil.

3. The heat-resistant-film-inserted B-stage resin composition sheet according to claim 2,
   wherein the thickness of the resin layer, attached to the metal foil side of the heat-resistant film, from tops of the convex portions of the metal foil is 3 to 10 μm and the thickness of the resin layer on the other surface of the heat-resistant film opposite to the metal-foil-attached surface is 10 to 100 μm.

4. The heat-resistant-film-inserted B-stage resin composition sheet according to claim 2,
   wherein the metal foil attached to the one surface of the sheet has the convex and concave portions on a metal foil surface facing the resin composition side.

5. The heat-resistant-film-inserted B-stage resin composition sheet according to claim 4,
   wherein the B-stage resin composition layer attached to the metal foil is formed of a B-stage resin composition for an additive process.

6. The heat-resistant-film-inserted B-stage resin composition sheet according to claim 1, wherein at least one of the B-stage resin composition layers is formed of a B-stage resin composition for an additive process.

7. The heat-resistant-film-inserted B-stage resin composition sheet according to claim 6, wherein the thickness of the B-stage resin composition layer for an additive process is 5 to 20 μm.

8. The heat-resistant-film-inserted B-stage resin composition sheet according to claim 6, wherein the resin composition for an additive process contains a resin component which, when the resin composition on which a circuit can be formed by an additive process is roughened with a roughening solution after curing treatment, is slightly soluble in the roughening solution and a component which is soluble in the roughening solution, and the resin component slightly soluble in the roughening solution contains, as an essential component, a resin composition including (a) a polyfunctional cyanate ester monomer and/or a polyfunctional cyanate ester prepolymer in an amount of 100 parts by weight, (b) an epoxy resin which is liquid at room temperature in an amount of 15 to 500 parts by weight, and (c) a heat-curing catalyst in a ratio of 0.005 to 10 parts by weight per 100 parts by weight of (a)+(b).

9. The heat-resistant-film-inserted B-stage resin composition sheet according to claim 8, wherein the resin composition contains 2–5-% by weight of at least two members selected from the group consisting of a butadiene-containing resin, an organic powder and an inorganic powder.

10. A multilayer printed wiring board produced by stacking a conductor circuit and an interlayer resin insulating layer on a substrate sequentially, wherein the interlayer resin insulating layer is comprised of the heat-resistant-film-inserted B-stage resin composition sheet of claim 1.

11. The multilayer printed wiring board according to claim 10, wherein the conductor circuit is formed by an additive process.

* * * * *